(12) United States Patent
Kim et al.

(10) Patent No.: US 10,580,486 B2
(45) Date of Patent: Mar. 3, 2020

(54) METHOD OF READING DATA ABOUT MEMORY DEVICE, METHOD OF CONTROLLING MEMORY CONTROLLER, AND STORAGE DEVICE INCLUDING MEMORY DEVICE AND MEMORY CONTROLLER

(71) Applicant: Samsung Electronics Co., Ltd., Suwon-si, Gyeonggi-do (KR)

(72) Inventors: Ji-su Kim, Seoul (KR); Dae-seok Byeon, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/217,315

(22) Filed: Dec. 12, 2018

(65) Prior Publication Data
US 2019/0198097 A1    Jun. 27, 2019

(30) Foreign Application Priority Data
Dec. 27, 2017 (KR) ......................... 10-2017-0181442

(51) Int. Cl.
| | | |
|---|---|---|
| *G11C 11/56* | (2006.01) | |
| *G11C 16/28* | (2006.01) | |
| *G11C 7/14* | (2006.01) | |
| *G11C 16/34* | (2006.01) | |

(Continued)

(52) U.S. Cl.
CPC ............ *G11C 11/5642* (2013.01); *G11C 7/14* (2013.01); *G11C 16/0483* (2013.01); *G11C 16/28* (2013.01); *G11C 16/34* (2013.01); *G11C 16/30* (2013.01); *G11C 2211/563* (2013.01)

(58) Field of Classification Search
CPC . G11C 11/5642; G11C 16/0483; G11C 16/30; G11C 16/28; G11C 2211/563; G11C 16/34; G11C 7/14
See application file for complete search history.

(56) References Cited

U.S. PATENT DOCUMENTS

| | | |
|---|---|---|
| 8,773,922 B2 | 7/2014 | Song et al. |
| 9,190,160 B2 | 11/2015 | Ok et al. |
| 9,343,163 B2 | 5/2016 | Kang |

(Continued)

FOREIGN PATENT DOCUMENTS

KR    10-2017-0086173    7/2017

*Primary Examiner* — Gene N Auduong
(74) *Attorney, Agent, or Firm* — Harness, Dickey and Pierce, P.L.C.

(57) ABSTRACT

A method of operating a memory device to read data may include determining, in a first read interval associated with a first read operation, a threshold voltage distribution of a most significant program state of a target logical memory page included in a first physical memory page among a plurality of physical memory pages, the first read operation being an operation of reading the target logical memory page of the first physical memory page; transmitting, to a memory controller, a distribution determination result, the distribution determination result being related to the threshold voltage distribution; receiving, from the memory controller, offset levels corrected based on the distribution determination result; and adjusting a read voltage based on offset levels prior to performing a second read operation on a second physical memory page among the plurality of physical memory pages.

20 Claims, 18 Drawing Sheets

(51) Int. Cl.
*G11C 16/04* (2006.01)
*G11C 16/30* (2006.01)

(56) References Cited

U.S. PATENT DOCUMENTS

| | | |
|---|---|---|
| 9,558,816 B2 | 1/2017 | Han et al. |
| 2009/0073771 A1* | 3/2009 | Li .................. G11C 11/5628 365/185.22 |
| 2011/0141818 A1* | 6/2011 | Li ...................... G11C 8/10 365/185.22 |
| 2013/0117635 A1 | 5/2013 | Ok et al. |
| 2015/0049548 A1 | 2/2015 | Park et al. |
| 2017/0133087 A1 | 5/2017 | Park et al. |
| 2017/0212693 A1 | 7/2017 | Sankaranarayanan et al. |
| 2018/0341553 A1* | 11/2018 | Koudele ............ G06F 11/142 |

\* cited by examiner

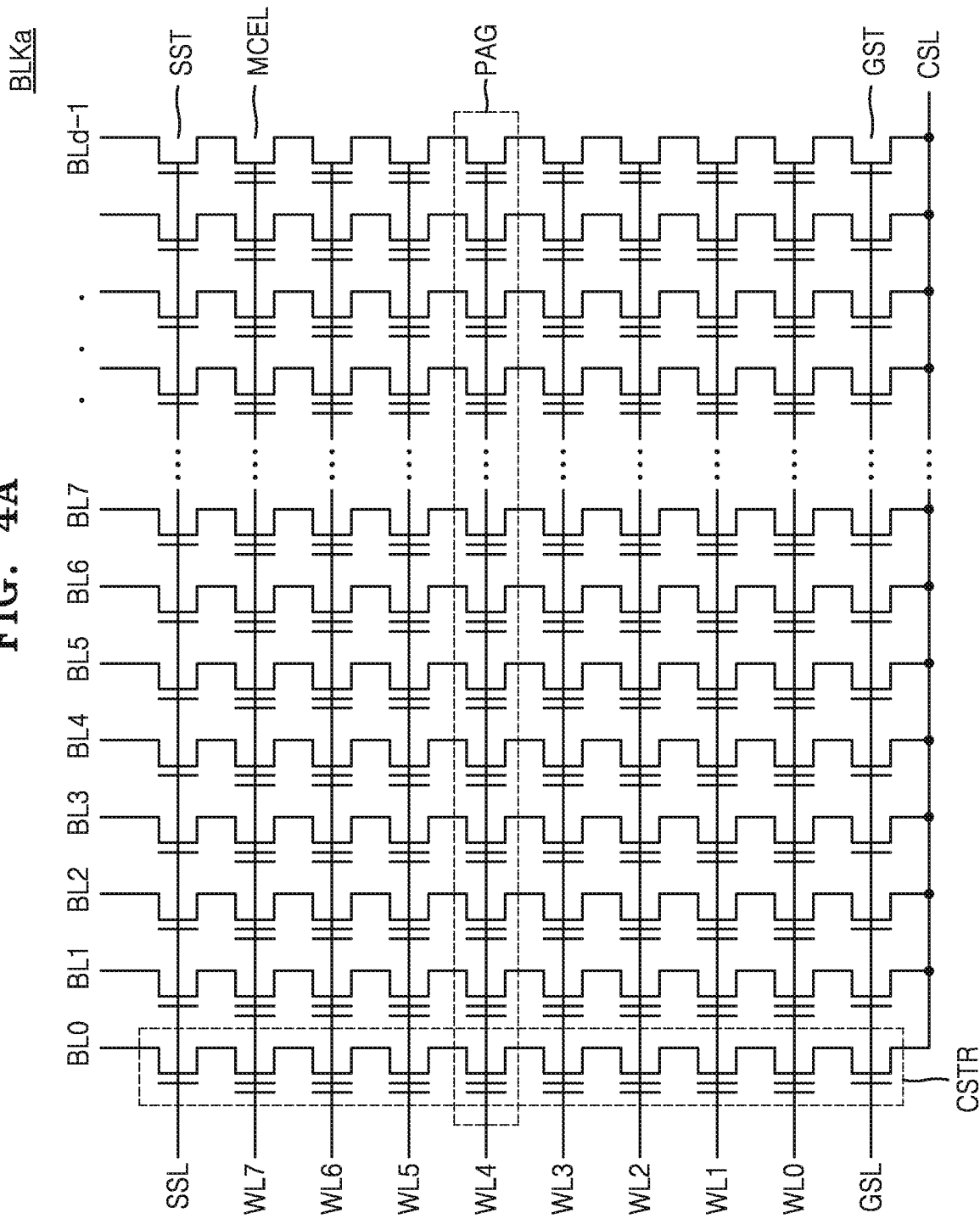

| OFFSET LEVEL COMPENSATION INFORMATION (OL_COM_INFO) | | | | | OL_COM_LUT |
|---|---|---|---|---|---|
| OFF_COUNT | ΔOL_1 | ΔOL_2 | ΔOL_3 | ⋯ | ΔOL_n |
| 0~CREF_1 | ΔVr1_1 | ΔVr2_1 | ΔVr3_1 | ⋯ | ΔVrn_1 |
| CREF_1~CREF_2 | ΔVr1_2 | ΔVr2_2 | ΔVr3_2 | ⋯ | ΔVrn_2 |
| CREF_2~CREF_3 | ΔVr1_3 | ΔVr2_3 | ΔVr3_3 | ⋯ | ΔVrn_3 |
| ⋮ | ⋮ | ⋮ | ⋮ | ⋮ | ⋮ |
| CREF_m−1~CREF_m | ΔVr1_m | ΔVr2_m | ΔVr3_m | ⋯ | ΔVrn_m |

| WLG | OL_1 | OL_2 | ... | OL_n |
|---|---|---|---|---|
| WLG_1 | V_11+ΔVr1_3 | V_12+ΔVr2_3 | ... | V_1n+ΔVrn_3 |
| WLG_2 | V_21+ΔVr1_3 | V_22+ΔVr2_3 | ... | V_2n+ΔVrn_3 |
| WLG_3 | V_31+ΔVr1_3 | V_32+ΔVr2_3 | ... | V_3n+ΔVrn_3 |
| ⋮ | ⋮ | ⋮ | ⋮ | ⋮ |
| WLG_k | V_k1+ΔVr1_3 | V_k2+ΔVr2_3 | ... | V_kn+ΔVrn_3 |

OFFSET LEVEL INFORMATION (OL_INFO)

FIG. 16A

OFFSET LEVEL COMPENSATION INFORMATION (OL_COM_INFO)

| # of P/E cycles | OL_COM_LUT |
|---|---|
| 0~NREF_1 | OL_COM_LUT_1 |
| NREF_1~NREF_2 | OL_COM_LUT_2 |
| NREF_2~NREF_3 | OL_COM_LUT_3 |
| ⋮ | ⋮ |
| NREF_$l$-1~NREF_$l$ | OL_COM_LUT_$l$ |

FIG. 16B

OFFSET LEVEL COMPENSATION INFORMATION (OL_COM_INFO)

| TEMPERATURE | OL_COM_LUT |
|---|---|
| ~TREF_1 | OL_COM_LUT_1 |
| TREF_1~TREF_2 | OL_COM_LUT_2 |
| TREF_2~TREF_3 | OL_COM_LUT_3 |
| ⋮ | ⋮ |
| TREF_$l$-1~ | OL_COM_LUT_$l$ |

METHOD OF READING DATA ABOUT MEMORY DEVICE, METHOD OF CONTROLLING MEMORY CONTROLLER, AND STORAGE DEVICE INCLUDING MEMORY DEVICE AND MEMORY CONTROLLER

CROSS-REFERENCE TO RELATED APPLICATION

This application claims the benefit of Korean Patent Application No. 10-2017-0181442, filed on Dec. 27, 2017, in the Korean Intellectual Property Office, the disclosure of which is incorporated herein in its entirety by reference.

BACKGROUND

Example embodiments of the inventive concepts relate to a memory device, a memory controller, and/or a storage device including the memory device and the memory controller. For example, at least some example embodiments relate to a method of operating a memory device to read data, a method of controlling a memory controller, and/or a storage device including the memory device and the memory controller.

Semiconductor memory devices may be divided into volatile memory devices which lose data stored therein when the power supply is turned off and nonvolatile memory devices which do not lose data stored therein. Volatile semiconductor memory devices may have fast read and write speeds, but content stored therein may be lost when an external power supply is cut off. On the other hand, nonvolatile memory devices may be slower in reading and writing compared with the volatile semiconductor memory device, but may retain the content therein even when the external power supply is cut off.

In a flash memory device, as an example of a nonvolatile memory device among semiconductor memory devices, it may be desirable to more precisely form threshold voltage distributions of memory cells included in the flash memory device as the number of bits of data stored in one memory cell increases. For example, when the threshold voltage distribution is formed at a position different from a predicted position, a problem such as a reading error may occur.

SUMMARY

Example embodiments of inventive concepts provide a method of operating a memory device to read data, a method of controlling a memory controller, and a storage device including the memory device and the memory controller. For example, at least some example embodiments relate to a method and device for performing a highly reliable reading operation even in a case where a threshold voltage distribution of memory cells is different from a predicted threshold voltage distribution.

According to some example embodiments of the inventive concepts, there is provided a method of operating a memory device to read data, the memory device including a plurality of physical memory pages connected to each of a plurality of word lines. In some example embodiments, the method may include determining, in a first read interval associated with a first read operation, a threshold voltage distribution of a most significant program state of a target logical memory page included in a first physical memory page among the plurality of physical memory pages, the first read operation being an operation of reading the target logical memory page of the first physical memory page; transmitting, to a memory controller, a distribution determination result, the distribution determination result being related to the threshold voltage distribution; receiving, from the memory controller, offset levels corrected based on the distribution determination result; and adjusting a read voltage based on offset levels prior to performing a second read operation on a second physical memory page among the plurality of physical memory pages.

According to some example embodiments of the inventive concepts, there is provided a method of operating a memory controller to control a memory device, the memory device including a plurality of physical memory pages connected to each of a plurality of word lines. In some example embodiments, the method may include controlling the memory device to perform a first read operation on a target logical memory page of a first physical memory page among the plurality of physical memory pages; receiving, from the memory device, a distribution determination result of a most significant program state of the target logical memory page; determining offset level compensation values based on the distribution determination result; updating offset level information based on the offset level compensation values to generate updated offset level information; and controlling the memory device to perform a second read operation on a second physical memory page among the plurality of physical memory pages based on the updated offset level information.

According to some example embodiments of the inventive concepts, there is provided a storage device. In some example embodiments, the storage device may include a memory device configured to determine, each time a read operation is performed on a target logical memory page included in a physical memory page, a threshold voltage distribution of a most significant program state of the target logical memory page for memory cells included in the physical memory page; and a memory controller configured to, receive a distribution determination result from the memory device, update offset level information based on the distribution determination result received from the memory device to generate updated offset level information, and control the read operation of the memory device based on the updated offset level information.

BRIEF DESCRIPTION OF THE DRAWINGS

Example embodiments of the inventive concepts will be more clearly understood from the following detailed description taken in conjunction with the accompanying drawings in which:

FIGS. 4A and 4B illustrate a memory block according to an example embodiment;

FIGS. 16A through 16C illustrate offset level compensation information according to an example embodiment;

DETAILED DESCRIPTION

Hereinafter, example embodiments of the inventive concepts will be described in detail with reference to the accompanying drawings.

Figure 1:
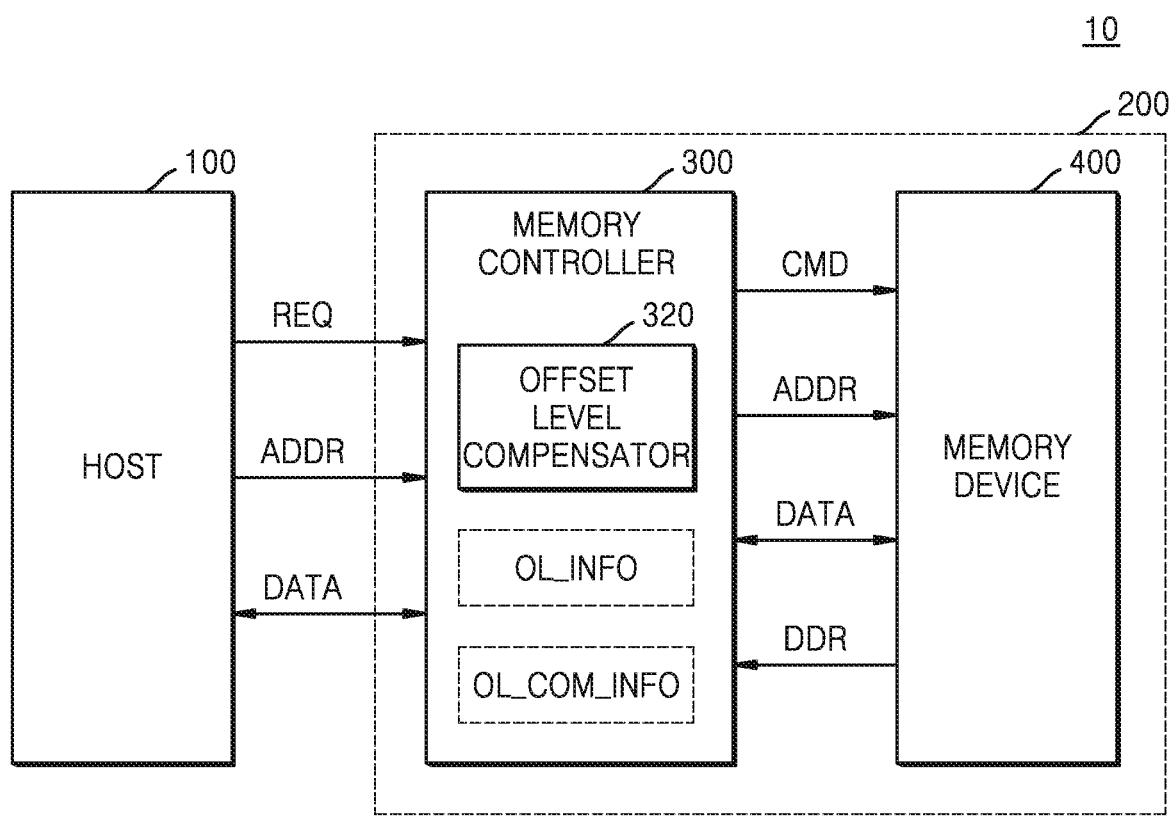
FIG. 1 illustrates a memory system according to an example embodiment.

FIG. 1 illustrates a system 10 according to an example embodiment.

Referring to FIG. 1, the system 10 may include a host 100 and a memory system 200, and the memory system 200 may include a memory controller 300 and a memory device 400. The system 10 may be provided as one of various computing systems such as an ultra mobile personal computer (PC) (UMPC), a workstation, a netbook, a personal digital assistant (PDA), a portable computer, a web tablet, a wireless phone, a mobile phone, a smart phone, an e-book, a portable multimedia player (PMP), a portable game machine, a navigation device, a black box, and a digital camera.

Each of the host 100, the memory controller 300, and the memory device 400 may be provided in one chip, one package, one module, or the like. However, example embodiments are not limited thereto. For example, the memory controller 300 may be provided together with the host 100 as an application processor. In addition, the memory controller 300 may be provided together with the memory device 400 as the memory system 200 or as a storage device.

The host 100 may send a data operation request REQ and an address ADDR to the memory controller 300, and may exchange data DATA with the memory controller 300. Illustratively, the host 100 may exchange the data DATA with the memory controller 300 based on at least one of various interface protocols such as a universal serial bus (USB) protocol, a multi media card (MMC) protocol, a peripheral component interconnection (PCI) protocol, a PCI-Express (PCI-E) protocol, an advanced technology attachment (ATA) protocol, a serial-ATA protocol, a paral-lel-ATA protocol, a small computer small interface (SCSI) protocol, an enhanced small disk interface (ESDI) Protocol, and a universal flash storage (UFS) protocol. However, example embodiments are not limited thereto.

The memory controller 300 may control the memory device 400 in response to a request from the host 100. For example, the memory controller 300 may read the data DATA stored in the memory device 400 in response to the data operation request REQ received from the host 100, or control the memory device 400 to write data DATA in the memory device 400. The memory controller 300 may control write, read, and erase operations of the memory device 400 by providing the address ADDR, a command CMD, a control signal, and the like to the memory device 400. In addition, the data DATA for the above operations may be transferred between the memory controller 300 and the memory device 400. The memory controller 300 may receive a distribution determination result (DDR) from the memory device 400. The distribution determination result DDR may indicate information about a result of determining by the memory device 400 a threshold voltage distribution of a most significant program state of a target logic memory page.

The memory controller 300 may include an offset level compensator 320, and may store offset level information OL_INFO and offset level compensation information OL_COM_INFO.

For example, the memory controller 300 may include an internal memory (for example, internal memory 340 in FIG. 2) configured to store the offset level information OL_INFO and the offset level compensation information OL_COM_INFO. However, example embodiment is not limited thereto. Unlike that illustrated in FIG. 1, the offset level information OL_INFO and the offset level compensation information OL_COMP_INFO may be stored in a memory in the memory system 200 outside of the memory controller 300. For example, in an example embodiment, the offset level information OL_INFO and the offset level compensation information OL_COMP_INFO may be stored in the memory device 300.

The offset level compensator 320 may determine offset level compensation values based on the distribution determination result DDR received from the memory device 400 and may correct (or update) the offset level information OL_INFO based on the determined offset level compensation values.

The offset level compensation information OL_COM_INFO may include an offset level compensation lookup table including the offset level compensation values corresponding to the distribution determination result DDR, and the offset level compensator 320 may determine the offset level compensation values by using the received distribution determination result DDR received from the memory device 400, and correct the offset level information OL_INFO based on the determined offset level compensation values. Operations of the offset level compensator 320 will be described in detail with reference to the following drawings.

The offset level compensator 320 may be implemented with hardware including a circuit and the like, and may be implemented by software including a plurality of programs and stored in the memory controller 300. In addition, when the offset level compensator 320 is implemented by software, the offset level compensator 320 may be implemented with some functions of a flash translation layer (FTL) and executed by a processor. However, the example embodiments are not limited thereto. For example, the offset level compensator 320 may be implemented with a combination of hardware and software.

The memory device 400 may include at least one memory cell array. The memory cell array may include a plurality of memory cells in regions where a plurality of word lines and a plurality of bit lines cross each other, and the plurality of memory cells may be nonvolatile memory cells. Each memory cell may be a multi-level cell (MTC) storing DATA about two bits or more. For example, each memory cell may be a 2-bit MLC storing DATA about 2 bits, a triple-level cell (TLC) storing DATA about 3 bits, a quadruple-level cell (QLC) storing DATA about 4 bits, or the MLC storing DATA about 5 bits or more. However, example embodiments of the inventive concepts are not limited thereto, and for example, some memory cells may be single-level cells (SLC) storing DATA about one bit, while other memory cells may be MLCs. The memory device 400 may include a NAND flash memory, a vertical NAND (VNAND) flash memory, a NOR flash memory, resistive random-access memory (RAM) (RRAM), phase-change RAM (PRAM), magnetoresistive RAM (MRAM), ferroelectric RAM (FRAM), spin transfer torque RAM (STT-RAM), etc., or a combination thereof. The memory device 400 may perform the write, read, and erase operations of data DATA in response to signals received from the memory controller 300.

When the memory device 400 performs the read operation on the target logic memory page of a physical memory page, the memory device 400 may determine the threshold voltage distribution of the most significant program state of the target logic memory page for the memory cells included in the physical memory page.

The memory device 400 may transmit the distribution determination result DDR indicating the determined result to the memory controller 300. For example, the memory device 400 may send the distribution determination result DDR along with a response signal corresponding to the status command signal received from the memory controller 300. A transmission method described above of the memory device 400 will be referred to as a status command method.

According to an example embodiment, the memory controller 300 may improve reliability of the read operation of the memory device 400 and reduce time consumption and speed deterioration due to the read operation error, by preemptively compensating the threshold voltage distribution before the read error occurs in the memory device 400 and controlling the read operation of the memory device 400, based on the distribution determination result DDR provided to the memory controller 300 by the memory device 400.

Figure 2:
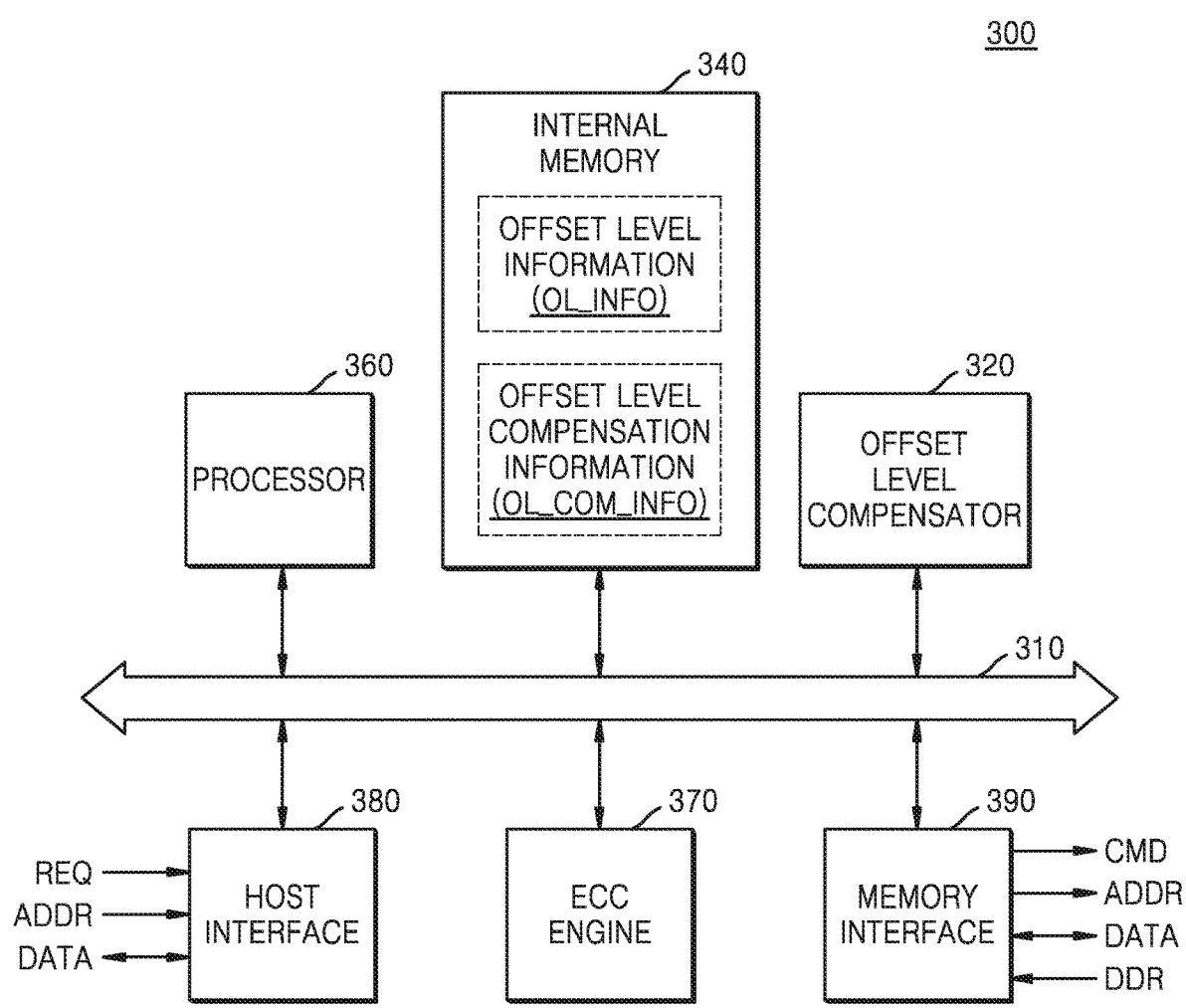
FIG. 2 illustrates a memory controller according to an example embodiment.

FIG. 2 illustrates the memory controller 300 according to an example embodiment.

Referring to FIG. 2, the memory controller 300 may include a bus 310, the offset level compensator 320, an internal memory 340, a processor 360, an error correction code (ECC) engine 370, a host interface 380, and a memory interface 390. The memory controller 300 may further include various other components, for example, a command generation module generating the command CMD to control a memory operation. Descriptions of the memory controller 300, which overlap those given with reference to FIG. 1, are omitted.

The bus 310 may provide a channel between internal components of the memory controller 300. The bus 310 may operate based on one of various bus protocols.

The offset level compensator 320 may determine the offset level compensation values based on the distribution determination result DDR received from the memory device and the offset level compensation information OL_COMP_INFO, and may correct the offset level information OL_INFO based on the determined offset level compensation values. The correcting the offset level information OL_INFO may be differently expressed as updating the offset level information OL_INFO.

The internal memory 340 may store various pieces of information used to operate of the memory controller 300. To this end, the internal memory 340 may be implemented by using various memories, and for example, by using at least one of cache memory, DRAM, SRAM, PRAM, and a flash memory device. The internal memory 340 may store the offset level information OL_INFO and the offset level compensation information OL_COM_INFO. The offset level information OL_INFO may be described in more detail with reference to FIG. 8, and the offset level compensation information OL_COM_INFO may be described in more detail with reference to FIGS. 13 and 16A through 16C.

The processor 360 may control a whole operation of the memory controller 300. The processor 360 may include a central processing unit (CPU) or a micro-processing unit. The processor 360 may execute firmware to control the memory controller 300, and the firmware may be loaded and executed by the internal memory 340.

The ECC engine 370 may perform an error correction operation on data DATA received from the memory device 400. For example, the ECC engine 370 may perform an ECC encoding process and an ECC decoding process by using an algorithm such as a Reed Solomon (RS) code, a Hamming Code, and a cyclic redundancy code (CRC). The ECC encoding process may include an operation of generating a parity bit based on data to be programmed, and the ECC decoding process may include an operation of detecting an error bit from data DATA read from the memory device 400 and an operation of correcting the detected error bit.

The host interface 380 may provide an interface between the host 100 and the memory controller 300. The host 100 and the memory controller 300 may transfer data DATA via one of various standard interfaces. Alternatively, the host 100 and the memory controller 300 may exchange data DATA via a plurality of interfaces among various standard interfaces. The memory controller 300 may receive the data operation request REQ and the address ADDR from the host 100 via the host interface 380, and may exchange data with the host 100.

The memory interface 390 may provide an interface between the memory device 400 and the memory controller 300. For example, the data DATA processed by the processor 360 may be stored in the memory device 400 via the memory interface 390. Alternatively, the data DATA stored in the memory device 400 may be provided to the processor 360 via the memory interface 390. The memory controller 300 may send the command CMD and the address ADDR to the memory device 400 via the memory interface 390, receive the distribution determination result DDR from the memory device 400, and exchange the data DATA with the memory device 400. For example, the memory controller 300 may receive the distribution determination result DDR from the memory device 400 in the status command method.

In some example embodiments, the memory controller 300 may include processing circuitry, memory and one or more I/O interfaces, where the processing circuitry may be configured, through a layout design or execution of computer readable instructions stored in the memory, as a special purpose computer to implement the offset level compensator 320 and/or ECC engine 370. For example, the processing circuitry may be the processor 360 such that the processor 360 executes computer readable instructions that configure the processor 360 as a special purpose processor to implement the offset level compensator 320 and/or ECC engine 370.

The processing circuitry may be, but not limited to, a processor, Central Processing Unit (CPU), a controller, an arithmetic logic unit (ALU), a digital signal processor, a microcomputer, a field programmable gate array (FPGA), an Application Specific Integrated Circuit (ASIC), a System-on-Chip (SoC), a programmable logic unit, a microprocessor, or any other device capable of performing operations in a defined manner.

The memory may include at least one of a volatile memory, non-volatile memory, random access memory (RAM), a flash memory, a hard disk drive, and an optical disk drive. For example, the memory may be the internal memory 340.

According to an example embodiment, the special purpose processing circuitry of the memory controller 300 may improve reliability of the read operation of the memory device 400 and reduce time consumption and speed deterioration due to the read operation error, by preemptively compensating the threshold voltage distribution before the read error occurs in the memory device 400 and controlling the read operation of the memory device 400, based on the distribution determination result DDR provided to the memory controller 300 by the memory device 400.

Figure 3:
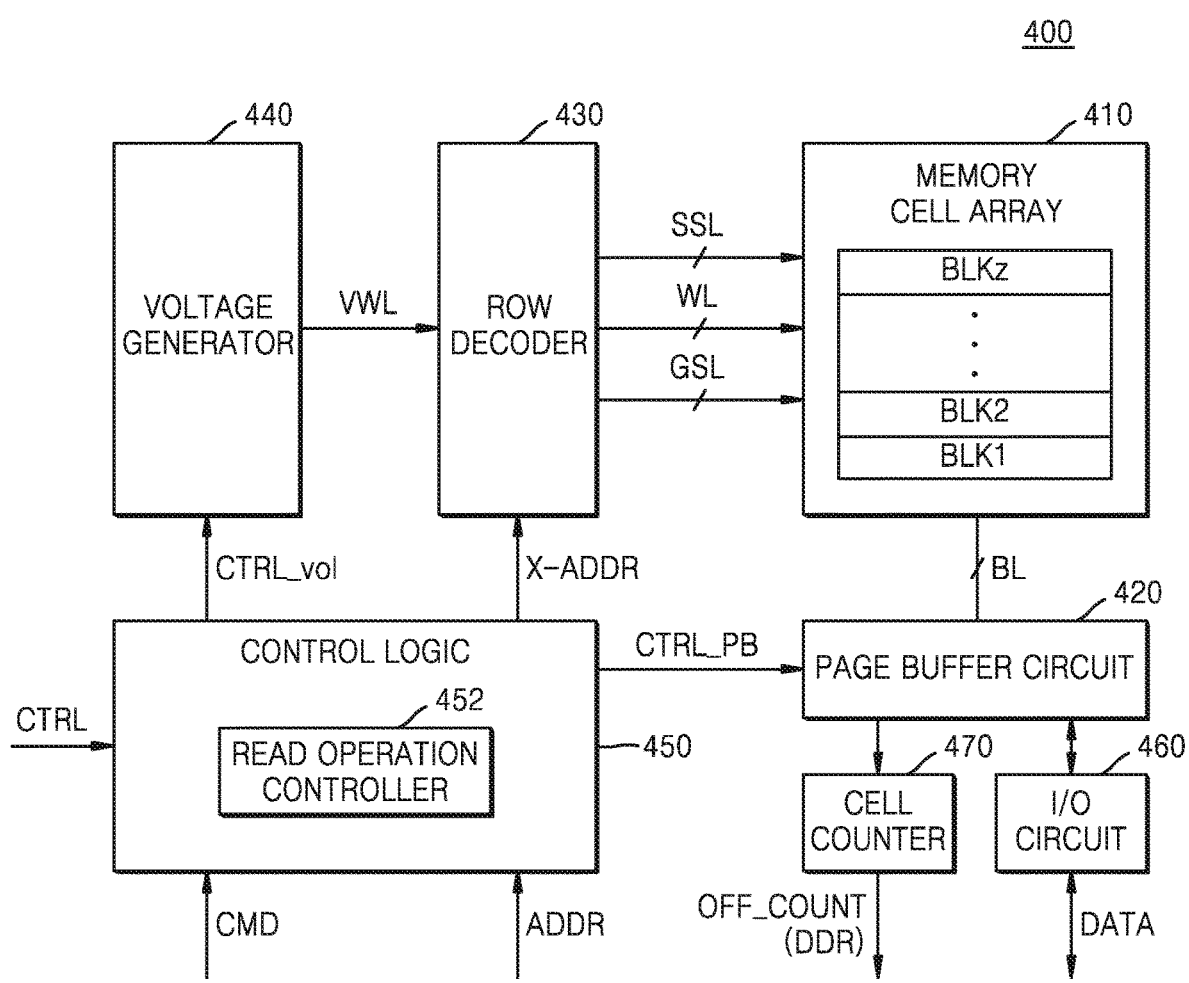
FIG. 3 illustrates a memory device according to an example embodiment.

FIG. 3 illustrates the memory device 400 according to an example embodiment. Descriptions of the memory device 400, which overlap those given with reference to FIG. 1, are omitted.

Referring to FIG. 3, the memory device 400 may include a memory cell array 410, a page buffer circuit 420, a row decoder 430, a voltage generator 440, a control logic 450, a data input/output circuit 460, and a cell counter 470.

The memory cell array 410 may include a plurality of memory blocks BLK1 through BLKz (z is an integer of 2 or more). Each of the memory blocks BLK1 through BLKz may include a plurality of memory cells. The memory cell array 410 may be connected to the row decoder 430 via word lines WL, string selection lines SSL, and ground select lines GSL, and may be connected to the page buffer circuit 420 via the bit lines BL. The memory cell array 410 may include strings respectively connected to the bit lines BLs. Here, each of the strings may include at least one string selection transistor connected in series between the bit line BL and a common source line CSL, the plurality of memory cells, and at least one ground selection transistor. Each of the strings may include at least one dummy cell between the string selection transistor and the memory cells, and at least one dummy cell between the ground selection transistor and the memory cells.

The page buffer circuit 420 may be connected to the memory cell array 410 via bit lines BL, and may perform the data write operation or the data read operation in response to a page buffer control signal CTRL_PB received from the control logic 450. The page buffer circuit 420 may be connected to data lines by selecting the bit lines BL and using a decoded column address.

The row decoder 430 may select some word lines WL based on a row address X-ADDR. The row decoder 430 may transfer a word line apply voltage to the word line WL. In the data write operation, the row decoder 430 may apply a programming voltage and a verify voltage to a selected word line WL, and a program inhibit voltage to an unselected word line WL. In the data read operation, the row decoder 430 may apply a read voltage to the selected word line WL and the read inhibit voltage to the unselected word line WL. In a data erase operation, the row decoder 430 may apply a word line erase voltage to the word line WL. In addition, the row decoder 430 may select some string selection lines or some ground selection lines based on the row address X-ADDR.

The voltage generator 440 may generate various kinds of voltages to perform the write, read, and erase operations on the memory cell array 410 based on the voltage control signal CTRL_vol received from the control logic 450. For example, the voltage generator 440 may generate a word line drive voltage VWL to drive the word lines WL. At this time, the word line drive voltage VWL may include a write voltage, a read voltage, a word line erase voltage, a write verify voltage, and the like. In addition, the voltage generator 440 may further generate a string selection line driving voltage to drive the string selection lines SSL and a ground selection line driving voltage to drive the ground selection lines GSL.

The control logic 450 may generate various internal control signals to store data DATA in the memory cell array 410 or read data DATA from the memory cell array 410 based on the command CMD, the address ADDR, and the control signal CTRL received from the memory controller 300. In other words, the control logic 450 may control various operations in the memory device 400 as a whole. The various internal control signals outputted from the control logic 450 may be provided to the page buffer circuit 420, the row decoder 430, the voltage generator 440, and the like. For example, the control logic 450 may provide the page buffer control signal CTRL_PB to the page buffer circuit 420, the row address X-ADDR to the row decoder 430, and the voltage control signal CTRL_vol to the voltage generator 440. However, types of the control signal are not limited thereto, and the control logic 450 may further provide other internal control signals. For example, the control logic 450 may provide a column address to the column decoder.

The control logic 450 may include a read operation controller 452. The read operation controller 452 may control the data read operation of the memory device 400. For example, when the memory device 400 performs the data read operation, the read operation controller 452 may control a read voltage applied to the word line WL via the voltage control signal CTRL_vol.

The data input/output (I/O) circuit 460 may be connected via the page buffer circuit 420 via the data lines DL, and may supply input data DATA to the page buffer circuit 420 or output the data DATA provided by the page buffer circuit 420 to the outside.

When the memory device 400 according to an example embodiment performs the read operation on the target logic memory page of the physical memory page, the memory device 400 may determine the threshold voltage distribution of the most significant program state of the target logic memory page for the memory cells included in the physical memory page, and transmit the distribution determination information DDR to the memory controller 300.

The cell counter 470 may generate the distribution determination result DDR and supply the distribution determination result DDR to the memory controller 300. For example, after the memory device 400 applies the read voltage to the word line WL connected to the physical memory page to determine the most significant program state of the target logic memory page, the cell counter 470 included in the memory device 400 may count the number of off-cells of the memory cells included in the physical memory page. The number of off-cells counted will be referred to as an off-count OFF_COUNT. The cell counter 470 may transmit the off-count OFF_COUNT to the memory controller 300 as the distribution determination result DDR.

In the data read operation, the memory device 400 may receive the offset level information OL_INFO that has been corrected based on the distribution determination result DDR from the memory controller 300 together with the command CMD, and the read operation controller 452 included in the control logic 450 may provide the voltage control signal CTRL_vol to the voltage generator 440 to adjust the read voltage based on the received offset level information.

In some example embodiments, the memory device 400 may include processing circuitry, memory and one or more I/O interfaces, where the processing circuitry may be configured, through a layout design or execution of computer readable instructions stored in the memory, as a special purpose computer to implement, for example, the control logic 450 including the read operation controller 452 and the mode information generator 454 and/or the cell counter 470.

The memory may include at least one of a volatile memory, non-volatile memory, random access memory (RAM), a flash memory, a hard disk drive, and an optical disk drive.

The processing circuitry may be, but not limited to, a processor, Central Processing Unit (CPU), a controller, an arithmetic logic unit (ALU), a digital signal processor, a microcomputer, a field programmable gate array (FPGA), an Application Specific Integrated Circuit (ASIC), a System-on-Chip (SoC), a programmable logic unit, a microprocessor, or any other device capable of performing operations in a defined manner.

Thus, the memory device 400 may improve the reliability of the read operation by adjusting the read voltage by preemptively compensating the threshold voltage distribution before the read error occurs, and may reduce the time consumption and the speed degradation due to the read error.

Figure 4B:
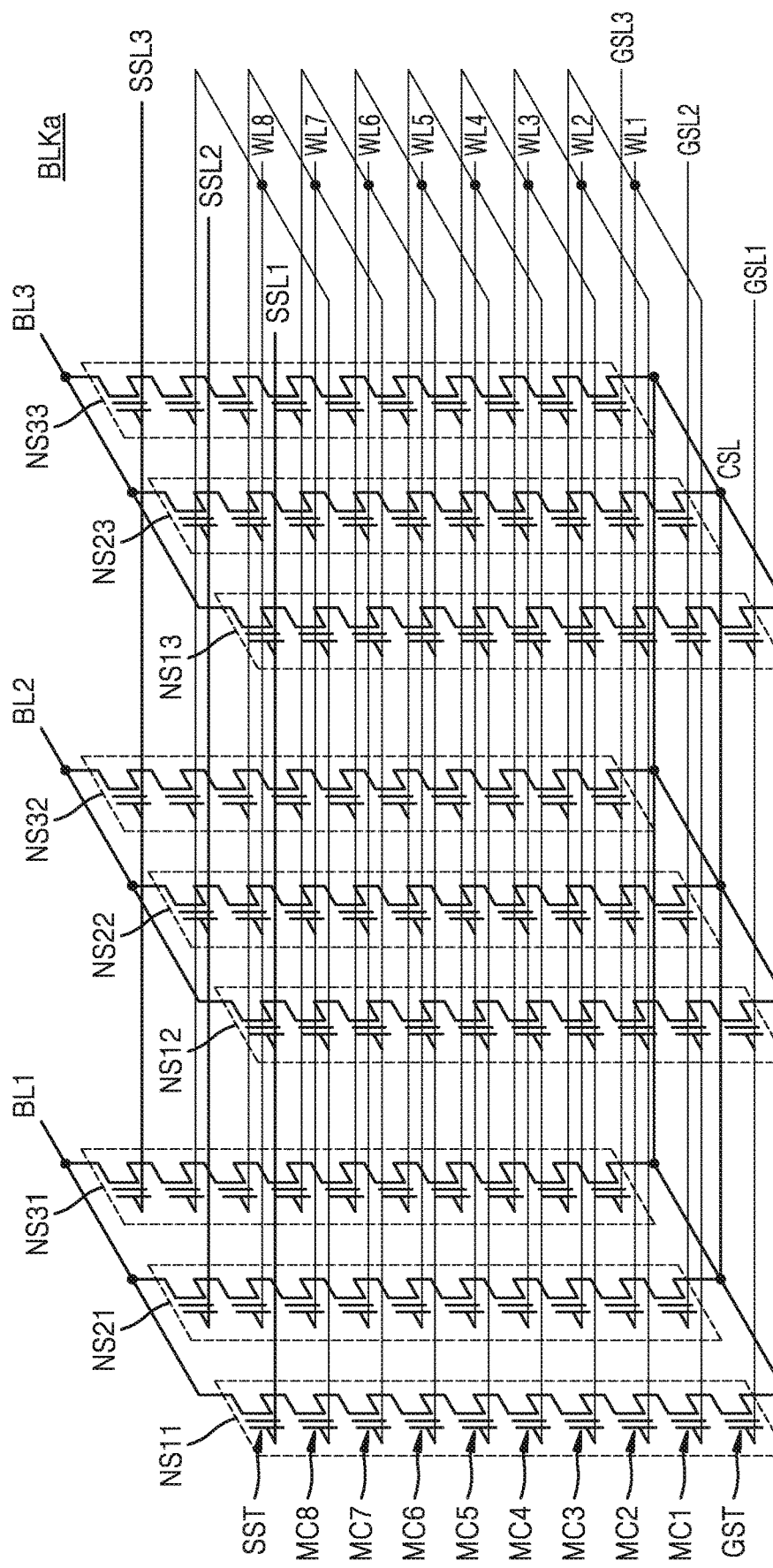

FIGS. 4A and 4B illustrate a memory block BLKa according to an example embodiment. Each of a plurality of memory blocks BLK1 through BLKz included in the memory cell array 410 in FIG. 3 may be the memory block BLKa illustrated in FIGS. 4A and 4B.

Referring to FIG. 4A, the memory block BLKa may include d (d is an integer of 2 or more) cell strings CSTR in which eight memory cells MCEL are connected in series in a direction of $0^{th}$ through $(d-1)^{th}$ bit lines BL0 through BLd-1. Each of the cell strings CSTR may include a string selection transistor SST and a ground selection transistor GST connected to both ends of the memory cells MCEL which are connected to each other in series. In addition, the string selection transistor SST may be connected to the string selection line SSL, and the ground selection transistor GST may be connected to the ground selection line GSL.

The NAND flash memory device having a structure as shown in FIG. 4A may be erased in units of block and may be written in units of physical pages PAG respectively corresponding to the $0^{th}$ through $7^{th}$ word lines WL0 through WL7. FIG. 4A illustrates an example in which eight pages PAG for eight word lines WL0 through WL7 are provided in one block. However, the blocks of the memory cell array 410 according to an example embodiment may have the memory cells MCEL and pages PAG in numbers different from the numbers of memory cells MCEL and pages PAG illustrated in FIG. 4A, respectively.

Referring to FIG. 4B, the memory block BLKa may include a plurality of NAND strings NS11 through NS33, a plurality of ground selection lines GLS1 through GSL3, a plurality of string selection lines SSL1 through SSL3, and a common source line CSL. Here, the number of NAND strings, the number of word lines WL, the number of bit lines BL, the number of ground selection lines GSL, and the number of string selection lines SSL may be variously changed according to an example embodiment.

The NAND strings NS11, NS21, and NS31 may be between the first bit line BL1 and the common source line CSL, the NAND strings NS12, NS22, and NS32 may be between the second bit line BL2 and the common source line CSL, and the NAND strings NS13, NS23, and NS33 may be between the third bit line BL3 and the common source line CSL. Each NAND string (for example, NS11) may include the string selection transistor SST, a plurality of memory cells MC, and the ground selection transistor GST, which are connected to each other in series.

The string selection transistor SST may be connected to each of corresponding string selection lines SSL1 through SSL3. The plurality of memory cells MC may be connected to corresponding word lines WL1 to WL8, respectively. The ground selection transistor GST may be connected to each of corresponding ground selection lines GSL1 to GSL3. The string selection transistor SST may be connected to the corresponding bit lines BL1 through BL3, and the ground selection transistor GST may be connected to the ground selection line GSL.

In FIG. 4B, each string is shown as including one string selection transistor SST, but the embodiment is not limited thereto, and each string may include a top string selection transistor and a bottom string selection transistor which are connected to each other in series. In addition, in FIG. 4B, each string is shown as including one ground selection transistor GST, but the embodiment is not limited thereto, and each string may include a top ground selection transistor and a bottom ground selection transistor which are connected to each other in series. In this case, the top ground selection transistors may be connected to the corresponding ground selection lines GSL1 through GSL3, and the bottom ground selection transistors may be commonly connected to the common ground selection line.

Figure 5:
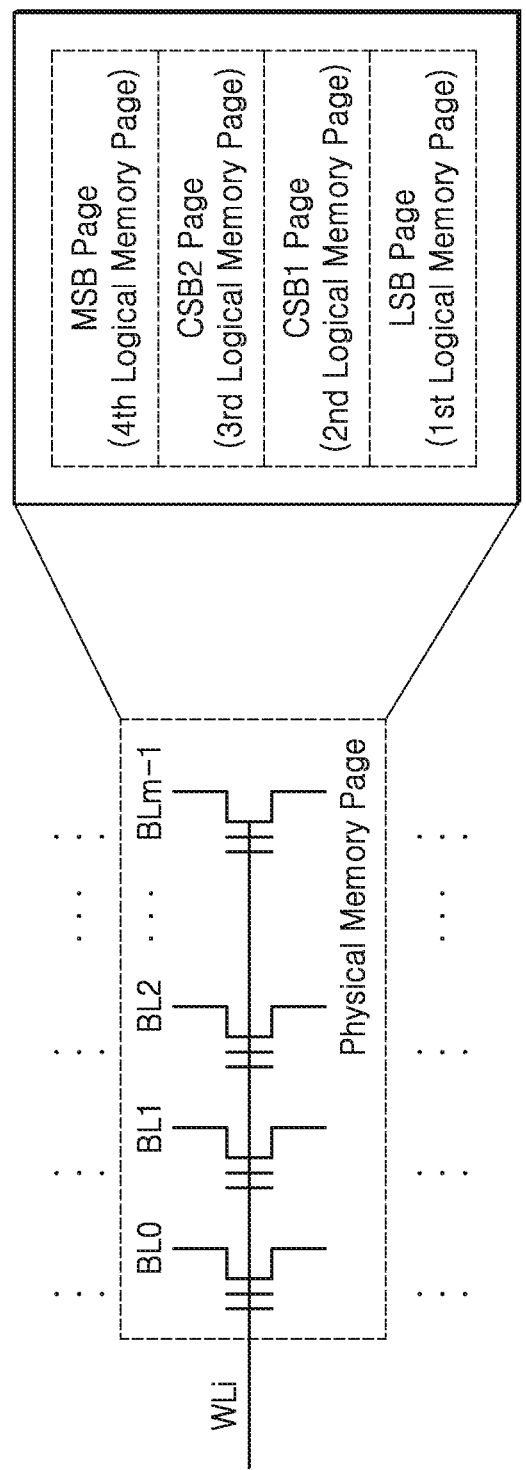
FIG. 5 illustrates a physical memory page according to an example embodiment.

FIG. 5 illustrates a physical memory page according to an example embodiment.

Referring to FIG. 5, the physical memory page may include memory cells connected to one word line WLi. For example, referring to FIG. 5, the physical memory page may include memory cells arranged in a region where the one word line WLi and the $0^{th}$ through $(m-1)^{th}$ bit lines BL0 through BLm-1 intersect each other.

Each memory cell may be the MLC storing DATA about two bits or more. For example, when the memory cells included in the physical memory page are MLCs storing DATA about two bits, each memory cell may store least significant bit (LSB) data and most significant bit (MSB) data. In this case, the physical memory page, which is logically divided into two pages, may include a first logical memory page and a second logical memory page. In addition, for example, when the memory cells included in the physical memory page are triple-level cells (TLC) storing DATA about three bits, each memory cell may store the LSB data, central significant bit (CSB) data and the MSB data. In this case, the physical memory page, which is logically divided into four pages, may include the first logical memory page, the second logical memory page, and a third logical memory page.

FIG. 5 illustrates, as a non-limiting example, a case where the memory cells included in the physical memory page are quadruple-level cells (QLC) storing DATA about four bits. In this case, each memory cell may store the LSB data, first central significant bit (CSB1) data, second central significant bit (CSB2) data, and the MSB data, and the physical memory page, which is logically divided into four pages, may include the first logical memory page, the second logical memory page, the third logical memory page, and a fourth logical memory page. The first logical memory page may be the least significant bit LSB page, the second logical memory page may be the first central significant bit CSB1 page, the third logical memory page may be the second central significant bit CSB2 page, and the fourth logical memory page may be the most significant MSB page. In the data read operation, a plurality of logical memory pages may be differentiated by addresses received from the memory controller 300. In other words, it may be understood that one read operation corresponding to one command signal received from the memory controller 300 is the read operation on one logical memory page.

When the read operation is performed on a target logical memory page which is one type of a plurality of logical memory pages included in a physical memory page, a memory device according to an example embodiment may determine the threshold voltage distribution of the most significant program state of the target logical memory page for the memory cells included in the physical memory page. A memory controller may receive distribution determination information from the memory device, and improve reliability of the read operation of the memory device by correcting offset level information based on the received distribution determination information and controlling the read operation of the memory device.

Figure 6:
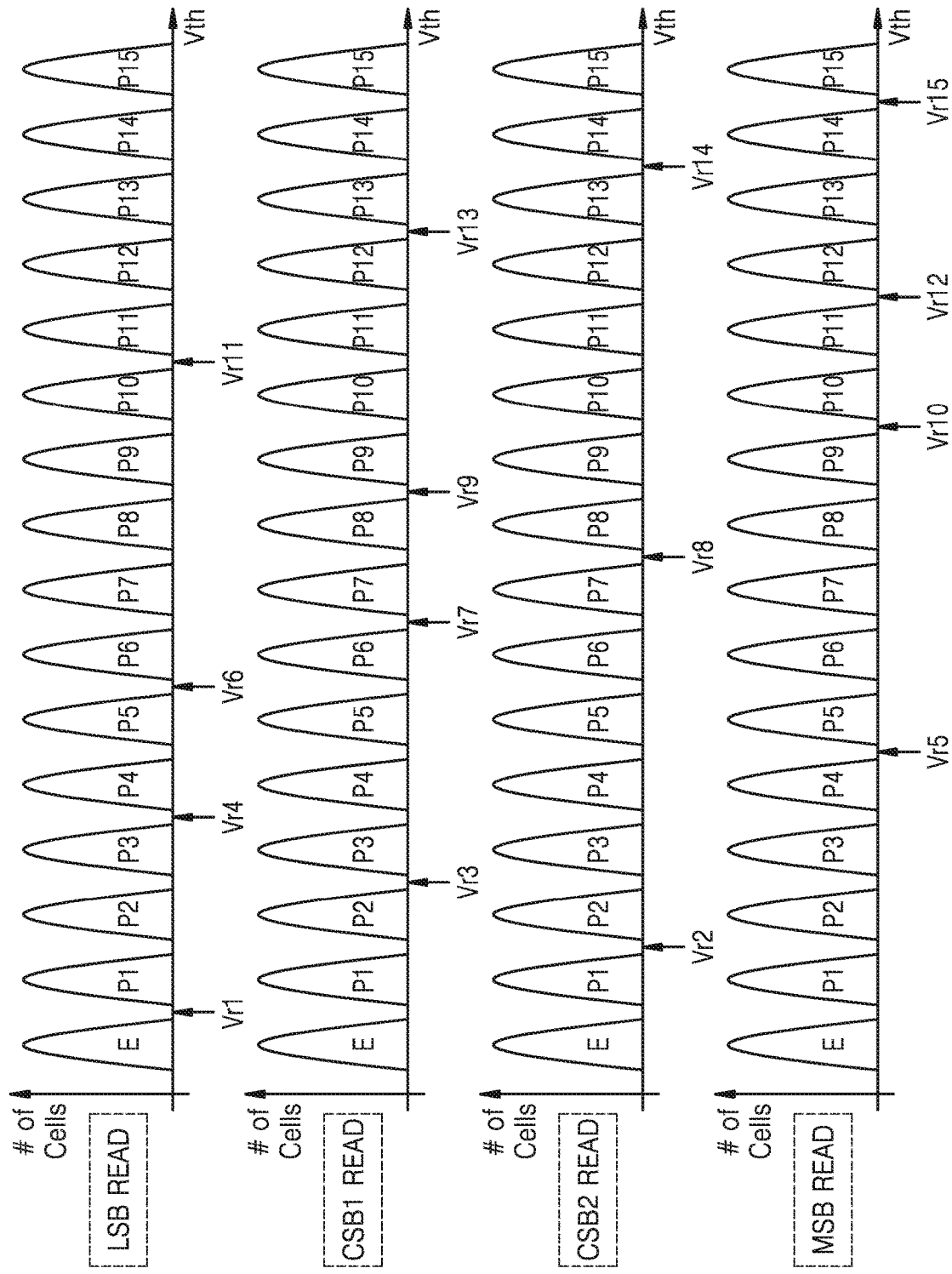
FIG. 6 illustrates graphs of threshold voltage distributions of memory cells for explaining a logical memory page read operation according to an example embodiment.

FIG. 6 illustrates graphs of the threshold voltage distributions of memory cells for explaining the read operation of the logical memory page according to an example embodiment. Although FIG. 6 illustrates graphs of the threshold voltage distributions in a case when the memory cells are quadruple-level cells (QLC), contents described with reference to FIG. 6 may be similarly applied to the memory cells storing different numbers of bits.

Referring to FIG. 6, when each of the memory cells is the QLC, a state of each of the memory cells may correspond to any one state of an erase state E, and first through fifteenth program states P1 through P15. Memory cells connected to one word line WL may include the least significant bit LSB page, the first central significant bit CSB1 page, the second central significant bit CSB2 page, and the most significant MSB page. The program states identified in the read operation on respective logical memory pages may be different from each other.

For example, in the read operation on the least significant bit LSB page, the memory device may identify the eleventh program state P11 by applying an eleventh read voltage Vr11 to the word line WL, and identify the sixth program state P6, the fourth program state P4, and the first program state P1 by applying a sixth read voltage Vr6, a fourth read voltage Vr4, and a first read voltage Vr1 to the word line WL, respectively.

Similarly, in the read operation on the first central significant bit CSB1 page, the memory device 400 may identify the thirteenth program state P13, the ninth program state P9, the seventh program state P7, and the third program state P3 by applying the thirteenth read voltage Vr13, the ninth read voltage Vr9, the seventh read voltage Vr7, and the third read voltage Vr3 to the word line WL, respectively.

Similarly, in the read operation on the second central significant bit CSB2 page, the memory device 400 may identify the fourteenth program state P14, the eighth program state P8, and the second program state P2 by applying the fourteenth read voltage Vr14, the eighth read voltage Vr8, and the second read voltage Vr2 to the word line WL, respectively.

Similarly, in the read operation on the most significant bit MSB page, the memory device 400 may identify the fifteenth program state P15, the twelfth program state P12, the tenth program state P10, and the fifth program state P5 by applying the fifteenth read voltage Vr15, the twelfth read voltage Vr12, the tenth read voltage Vr10, and the fifth read voltage Vr5 to the word lines WL, respectively.

The eleventh program state P11 may be referred to as a most significant program state of the least significant bit LSB page, the thirteenth program state P13 may be referred to as the most significant program state of the first central significant bit CSB1 page, the fourteenth program state P14 may be referred to as the most significant program state of the second central significant bit CSB2 page, and the fifteenth program state P15 may be referred to as the most significant program state of the most significant bit MSB page.

Figure 7:
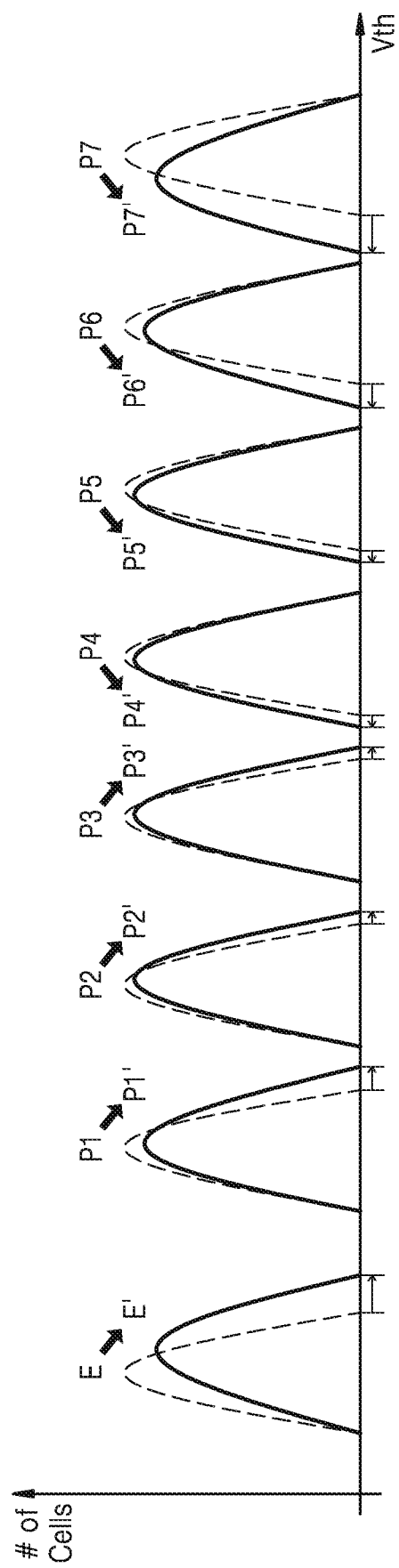
FIG. 7 illustrates graphs of threshold voltage distributions of memory cells for explaining deterioration of the threshold voltage distributions according to an example embodiment.

FIG. 7 illustrates graphs of threshold voltage distributions of the memory cells for explaining deterioration of the threshold voltage distributions according to an example embodiment. For convenience of description, FIG. 7 illustrates a case where the memory cells are TLCs, but the embodiment is not limited thereto.

Referring to FIG. 7, the state of each of the memory cells may correspond to one of the erase state E and the first through seventh program states P1 through P7. The threshold voltage distributions of the erase state E and the first through seventh program states P1 through P7 may represent ideal shapes.

The ideal threshold voltage distributions of the erase state E and the first through seventh program states P1 through P7 may be changed due to various environmental factors. The environmental factors may include, as non-limited examples, retention times, read disturb, temperature bumps, and the like. The retention time may be a time elapsed at a high temperature or room temperature after a program operation for a memory cell is performed and may be referred to as a data retention time. The read disturb may indicate a phenomenon in which the threshold voltage distribution of the memory cells connected to the adjacent word line deteriorates as the read operation is repeatedly performed on the memory cells connected to the selected word line. The temperature bump may indicate a phenomenon in which the threshold voltage distribution of memory cells deteriorates as a result of performing a high temperature program/high temperature reading, a high temperature program/low temperature reading, a low temperature program/high temperature reading, and a low temperature program/low temperature reading. Due to various environmental factors described above, the threshold voltage distribution may be deteriorated so that the erased state E is changed to an erased state E', and the first through fourth program states P1 through P7 are respectively changed to a changed first program state P1' through changed seventh program state P7'. An amount of change in the threshold voltage distribution may be different for each program state. For example, the amount of change in the threshold voltage distribution from the erased state E to the changed erased state E' may indicate a positive value, and the amount of change in the threshold voltage distribution from the seventh programmed state P7 to the changed seventh programmed state P7' may indicate a negative value. At this time, the amount of change in the threshold voltage distribution may be further increased toward a next significant program state. Variations of the threshold voltage distributions may not be limited to shapes illustrated in FIG. 7. For example, the amount of change in the threshold voltage distribution from the erased state E to the changed erased state E' may indicate a positive value, and the amount of changes in the threshold voltage distributions from the first through seventh program states P1 through P7 to the changed first through seventh program states P1' through P7' may represent negative values.

As illustrated in FIG. 7, the threshold voltage distribution of the memory cells may be deteriorated by various environmental factors. When the amount of change in the threshold voltage distribution is large, an error in the read operation may occur. The memory device and the memory controller according to an example embodiment may improve the reliability of the read operation by determining the distribution before the error of the read operation occurs and preemptively adjusting the read voltage in advance, and thus, the time consumption and the speed reduction due to read errors may be reduced.

Figure 8:
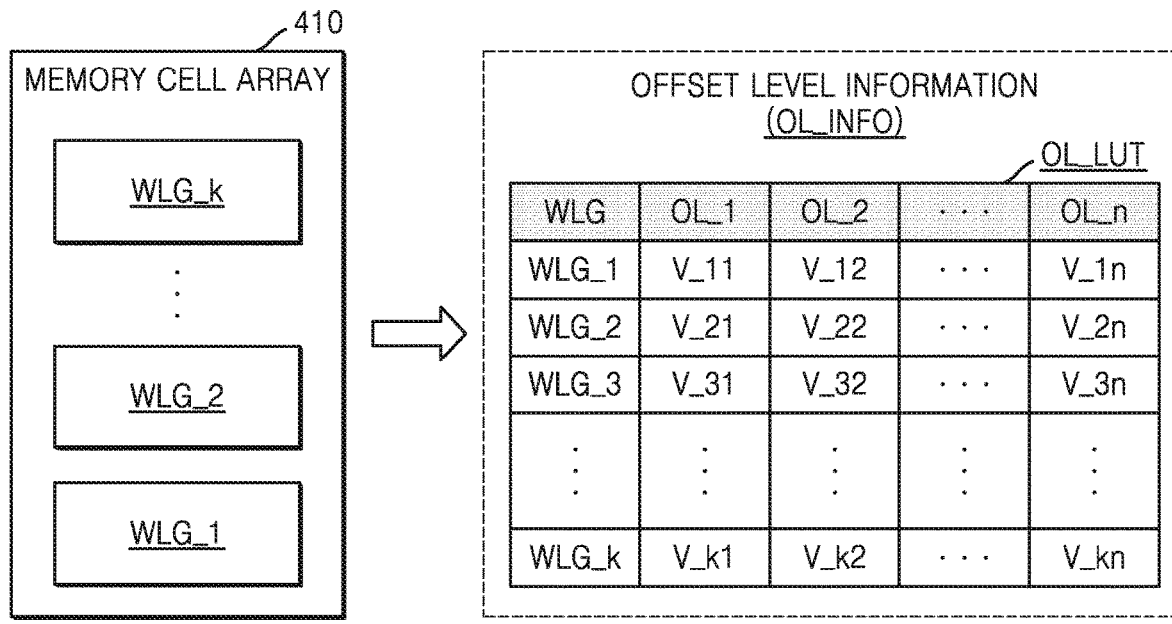
FIG. 8 illustrates a memory cell array and offset level information according to an example embodiment.

FIG. 8 illustrates the memory cell array 410 and the offset level information OL_INFO according to an example embodiment. Descriptions of the memory cell array 410 that are the same as those given with reference to FIGS. 3, 4A, and 4B are omitted.

Referring to FIG. 8 the plurality of word lines WL connected to the memory cell array 410 may be grouped into k (k is a natural number) word line groups WLG_1 through WLG_k. Each of the word line groups WLG_1 through WLG_k may include at least one word line WL. Each of the word line groups WLG_1 through WLG_k may include one word line WL connected to one of the memory blocks BLK1 through BLKz in FIG. 3.

The memory controller may store information about the offset level of the readout voltage as the offset level information OL_INFO. The offset level information OL_INFO may include an offset level lookup table OL_LUT including offset levels OL_1 through OL_n (n is a natural number) of the read voltages respectively corresponding to the word line groups WLG_1 through WLG_k. For convenience of description, the offset level of the readout voltage will be referred to as the offset level in short below. Each of the first through nth offset levels OL_1 through OL_n may indicate the offset level of each of the first through nth readout voltages.

In controlling the data read operation, the memory controller may provide the offset levels OL_1 through OL_n to the memory device and perform the read operation by adjusting the read voltages based on received offset levels OL_1 through OL_n.

Figure 9:
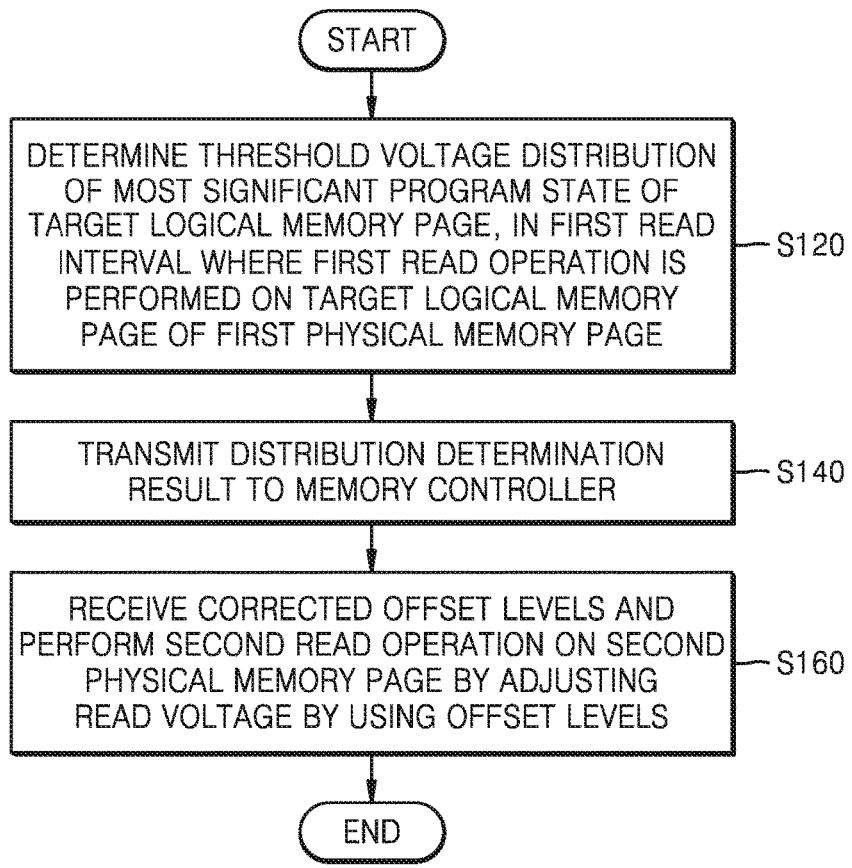
FIG. 9 is a flowchart for explaining a method of reading DATA about a memory device according to an example embodiment.

FIG. 9 is a flowchart for explaining a method of operating a memory device to read data DATA according to an example embodiment.

In operation S120, during a first readout interval, in which a first read operation is performed on the target logical memory page of the first physical memory page, the memory device 400 may determine the threshold voltage distribution at the most significant program state of the target logical memory page for the memory cells included in the first physical memory page. The target logical memory page may include one of the least significant bit LSB page, at least one of central significant bit CSB pages, and the most significant bit MSB page.

In operation S140, the memory device 400 may transmit the distribution determination result DDR to the memory controller 300. For example, the memory device 400 may count the number of off-cells among the memory cells after applying the read voltage to the word line WL connected to the first memory page in the first read interval in order to determine the most significant program state of the target logical memory page, and may transmit the off-count OFF_COUNT indicating the number of off-cells to the memory controller 300 as the distribution determination result DDR.

In operation S160, the memory device 400 may receive corrected offset levels based on the distribution determination result DDR transmitted to the memory controller 300, and may perform a second read operation on a second memory page by adjusting the read voltage using the corrected offset levels.

Figure 10:
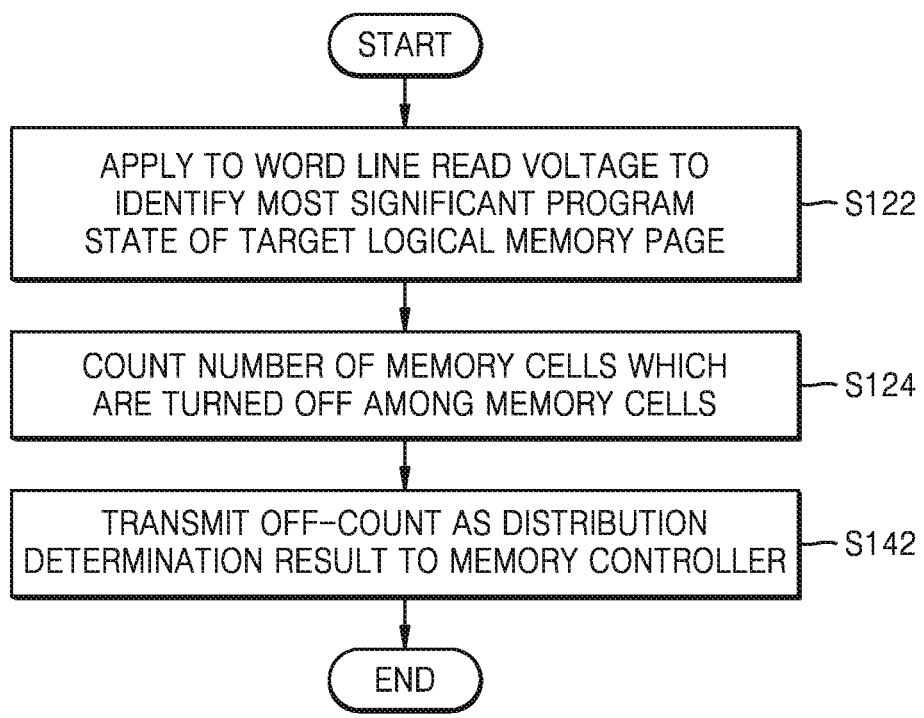
FIG. 10 is a flowchart of a method of determining a distribution of a memory device, and transmitting a distribution determination result according to an example embodiment.

FIG. 10 is a flowchart of a method of determining a distribution of the memory device 400 and transmitting a distribution determination result DDR, according to an example embodiment. For example, FIG. 10 may represent the embodiments of operations S120 and S140 (there may be more like this) in FIG. 10.

Referring to FIG. 10, the memory device 400 may apply the read voltage to the word line WL connected to the first physical memory page in order to determine the most significant program state of the target logical memory page (S122). Thereafter, the memory device 400 may apply the read voltage to the word line WL connected to the first physical memory page in order to determine the next significant program state of the target logical memory page. The next most significant program state of the target logical memory page may indicate a second highest program state among the program states to be determined in the read operation of the target logical memory page.

In operation S124, the memory device 400 may count the number of off-cells after the read voltage is applied to determine the most significant program state of the target logical memory page among the memory cells included in the first physical memory page. The memory device 400 may perform the counting of the number of off-cells in a pipelined manner simultaneously with the applying of the read voltage to determine the next significant program state of the target logical memory page.

In operation S142, the memory device 400 may transmit the off-count OFF_COUNT indicating the number of counted off-cells to the memory controller 300 as the distribution determination result DDR.

Figure 11:
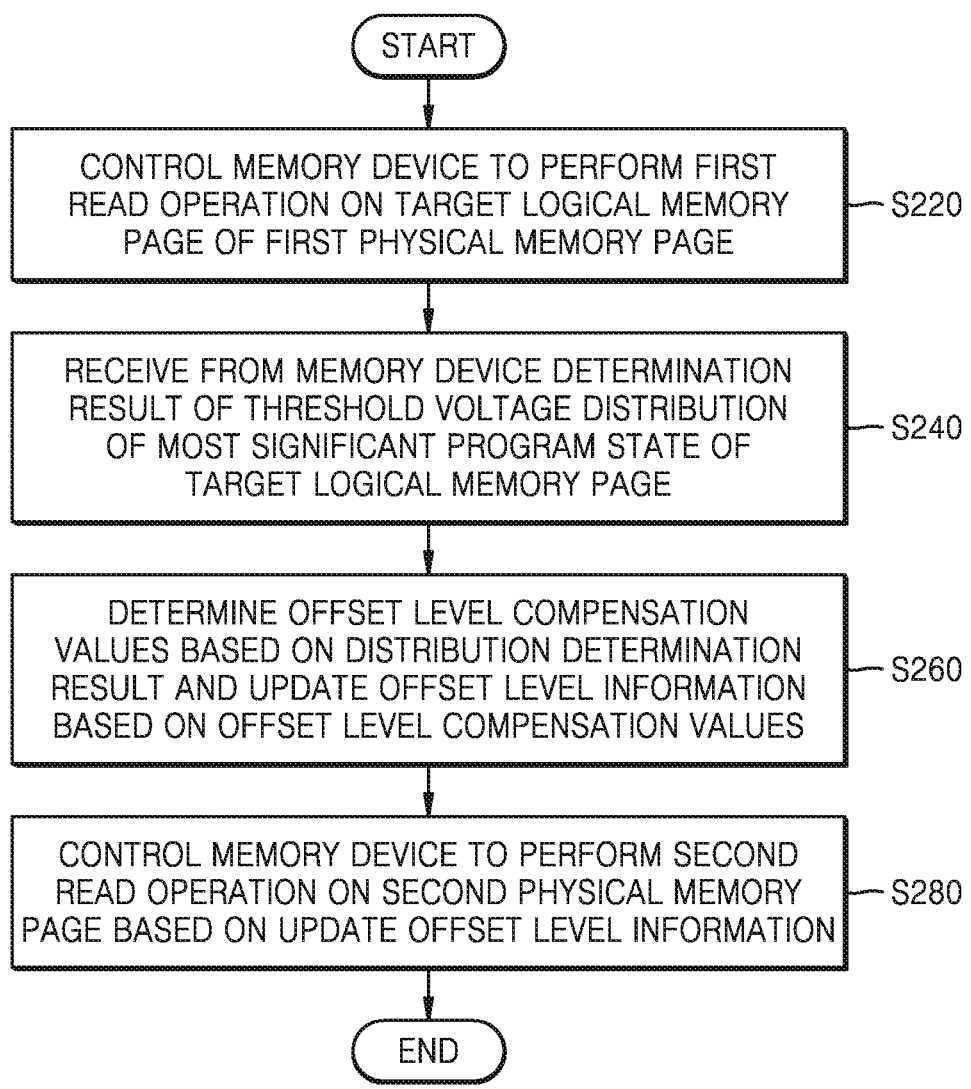
FIG. 11 is a flowchart of a method of controlling a read operation of a memory controller, according to an example embodiment.

FIG. 11 is a flowchart of a method of controlling the read operation of the memory controller 300 according to an example embodiment.

Referring to FIG. 11, in operation S220, the memory controller 300 may control the memory device 400 to perform the first read operation on the target logical memory page of the first physical memory page. The target logical memory page may include one of the least significant bit LSB page, at least one of central significant bit CSB pages, and the MSB page.

In operation S240, the memory controller 300 may receive the distribution determination result DDR from the memory device 400. The distribution determination result DDR may represent the result of determining the threshold voltage distribution of the most significant program state of the target logical memory page for the memory cells included in the first physical memory page For example, the memory controller 300 may receive from the memory device 400, as the determination result, the off-count OFF_COUNT indicating the number of off-cells which are turned off after the read voltage for determining the most significant program state of the target logical memory page is applied to the word line WL in order to determine the most significant program state of the target logical memory page.

In operation S260, the memory controller 300 may determine the offset level compensation values based on the received distribution determination result DDR and update the offset level information OL_INFO based on the determined offset level compensation values For example, the memory controller 300 may determine the offset level compensation values based on the received distribution determination result DDR and the received offset level compensation information OL_COM_INFO. The offset level compensation information OL_COM_INFO may include the offset level compensation look-up table including the offset level compensation values corresponding to the distribution determination result DDR.

In operation S280, the memory controller 300 may control the memory device 400 to perform the second read operation on the second physical memory page based on the updated offset level information OL_INFO. For example, the memory controller 300 may control the memory device 400 by transmitting to the memory device 400 the offset levels, loaded on the read command, which correspond to the second physical memory page included in the updated offset level information OL_INFO.

Figures 12, 13:
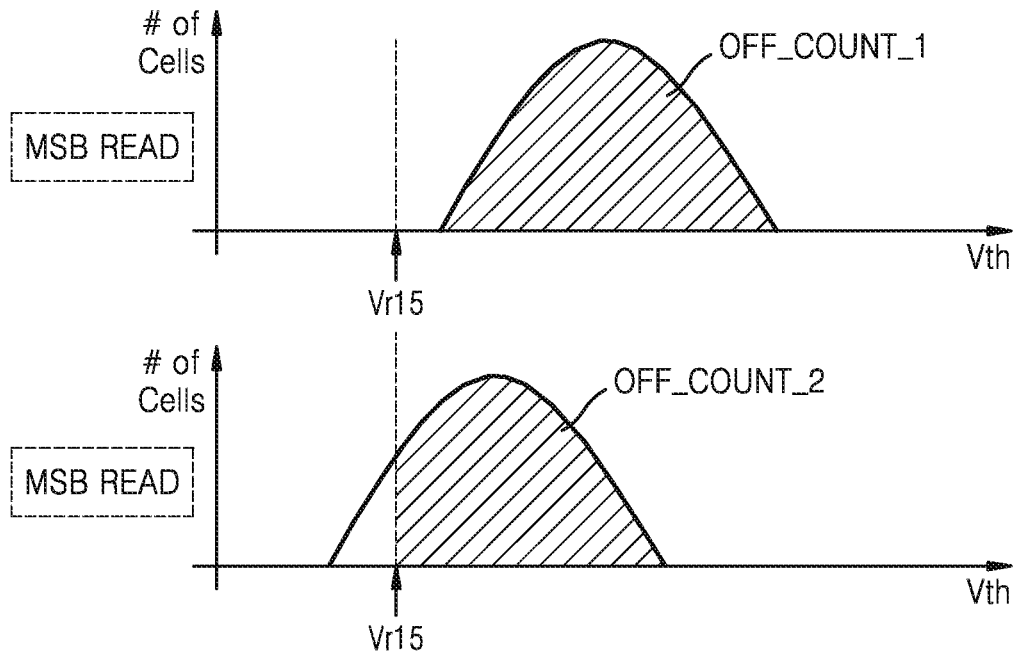
FIG. 12 illustrates graphs of the threshold voltage distributions of a most significant program state of a logical memory page according to an example embodiment.
FIG. 13 illustrates offset level compensation information according to an example embodiment.

FIG. 12 illustrates graphs of the threshold voltage distributions of the most significant program state of the logical memory page according to an example embodiment. FIG. 12 illustrates the case where the target logical memory page is the most significant bit MSB page, but the technical idea of the present disclosure may be equally applied when the target logical memory page is another type of logical memory page.

Referring to FIGS. 10 and 12, the upper graph in FIG. 12 illustrates the threshold voltage distribution before the distribution deterioration due to environmental factors occurs.

The memory device 400 may count the number of cells which are turned off after the memory device 400 applies the fifteenth readout voltage Vr15 to identify the fifteenth program state which is the most significant program state of the most significant bit MSB page. At this time, the off-count OFF_COUNT indicating the number of cells which are turned off may be a first off-count OFF_COUNT_1.

The lower graph in FIG. 12 illustrates the threshold voltage distribution after the distribution deterioration due to environmental factors occurs.

The memory device 400 may count the number of cells which are turned off after the memory device 400 applies the fifteenth readout voltage Vr15 to identify the fifteenth program state which is the most significant program state of the most significant bit MSB page. At this time, the off-count OFF_COUNT indicating the number of cells which are turned off may be a second off-count OFF_COUNT_2.

When the first off-count OFF_COUNT_1 and the second off-count OFF_COUNT_2 are compared with each other, the second off-count OFF_COUNT_2 may have a value smaller than the first off-count OFF_COUNT_1. This may be a result of the distribution degradation. Thus, it may be possible to determine the distribution degradation of the memory page by identifying the most significant program state of the target logical memory page. A memory controller according to an example embodiment may determine offset level compensation values based on the distribution determination information received from a memory device and may compensate for the distribution degradation by correcting offset level information.

FIG. 13 illustrates the offset level compensation information OL_COMP_INFO according to an example embodiment.

Referring to FIGS. 2 and 13, the offset level compensation information OL_COM_INFO may include an offset level compensation lookup table OL_COM_LUT including first through $n^{th}$ offset level compensation values $\Delta OL\_1$ through $\Delta OL\_n$ corresponding to the distribution determination information. For example, the offset level compensation information OL_COM_INFO may include the offset level compensation lookup table OL_COM_LUT including the first through $n^{th}$ offset level compensation values $\Delta OL\_1$ through $\Delta OL\_n$ corresponding to the offset level compensation information OL_COM_INFO.

The offset level compensator 320 included in the memory controller 300 may determine the first through $n^{th}$ offset level compensation values $\Delta OL\_1$ through $\Delta OL\_n$ by comparing the offset count OFF_COUNT which is received from the memory device 400 as the distribution determination result DDR with the offset level compensation lookup table OL_COM_LUT included in the offset level compensation information OL_COM_INFO.

For example, when the off-count OFF_COUNT is equal to or greater than a first reference count CREF_1 and less than a second reference count CREF_2, the offset level compensator 320 may determine values of the first through nth offset level compensation values $\Delta OL\_1$ through $\Delta OL\_n$ as first through nth compensation read voltages $\Delta Vr1\_2$ through $\Delta Vrn\_2$. Here, the first through $n^{th}$ offset level compensation values $\Delta OL\_1$ through $\Delta OL\_n$ may all have the same value, and at least some of them may have different values. For example, some of the first through $n^{th}$ offset level compensation values $\Delta OL\_1$ through $\Delta OL\_n$ may have positive values, and the other of them may have negative values. For example, when the off-count OFF_COUNT is equal to or greater than a second reference count CREF_2 and less than a third reference count CREF_3, the offset level compensator 320 may determine values of the first through $n^{th}$ offset level compensation values $\Delta OL\_1$ through $\Delta OL\_n$ as first through nth compensation read voltages $\Delta Vr1\_3$ through $\Delta Vrn\_3$.

Figures 14, 15:
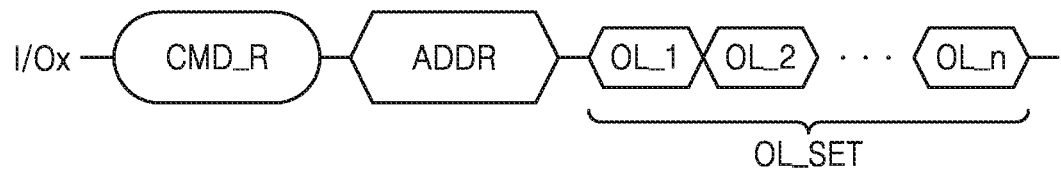
FIG. 14 illustrates corrected offset level information based on the offset level compensation information of FIG. 13 according to an example embodiment.
FIG. 15 illustrates a set of read commands according to an example embodiment.

FIG. 14 illustrates offset level information OL_INFO which is corrected based on the offset level compensation information OL_COM_INFO of FIG. 13 according to an example embodiment.

Referring to FIGS. 2, 13 and 14, as an example for convenience of description, FIG. 14 illustrates the offset level information OL_INFO which is corrected for a case where the off-count OFF_COUNT is equal to or greater than the second reference count CREF_2 and less than the third reference count CREF_3. However, example embodiments are not limited thereto.

As described above with reference to FIG. 13, the offset level compensator 320 may determine the first through $n^{th}$ offset level compensation values $\Delta OL\_1$ through $\Delta OL\_n$ as the first through $n^{th}$ compensation read voltages $\Delta Vr1\_3$ through $\Delta Vrn\_3$. The offset level compensator 320 may correct the offset level information OL_INFO based on the determined first through $n^{th}$ offset level compensation values $\Delta OL\_1$ through $\Delta OL\_n$. For example, the offset level compensator 320 may correct values corresponding to the first offset level OL_1 by adding the first compensation read voltage $\Delta Vr1\_3$ which is the first offset level compensation value $\Delta OL\_1$. For example, the offset level compensator 320 may correct values corresponding to the nth offset level OL_n by adding the $n^{th}$ compensation read voltage ΔVrn_3 which is the nth offset level compensation value ΔOL_n. When the memory controller 300 subsequently controls the reading operation of the memory device 400, the memory controller 300 may control the memory device 400 based on the offset level information OL_INFO corrected as described above.

FIG. 15 illustrates a set of read commands according to an example embodiments.

Referring to FIGS. 1 and 15, the memory controller 300 may transmit to the memory device 400 the first through $n^{th}$ offset levels OL_1 through OL_n applied to the read command set to control the read operation of the memory device 400 based on the offset level information OL_INFO.

For example, the memory controller 300 may transmit a read command CMD_R, the address ADDR, and an offset level set OL_SET via an input/output line I/Ox. FIG. 15 illustrates that the offset level set OL_SET being bits located after the address ADDR, but example embodiments are not limited thereto. The offset level set OL_SET may be included ahead of the read command CMD_R or may be included between the read command CMD_R and the address ADDR.

The memory controller 300 may select the first through $n^{th}$ offset levels OL_1 to OL_n corresponding to the selected word line based on the corrected offset level information OL_INFO as illustrated in FIG. 13, and may load the offset level set OL_SET including the selected first through $n^{th}$ offset levels OL_1 through OL_n on the read command signal as illustrated in FIG. 15 and may transmit the offset level set OL_SET to the memory device 400. The memory device 400 may perform the read operation by adjusting the read voltage by using the received first through $n^{th}$ offset levels OL_1 through OL_n.

Figure 16C:
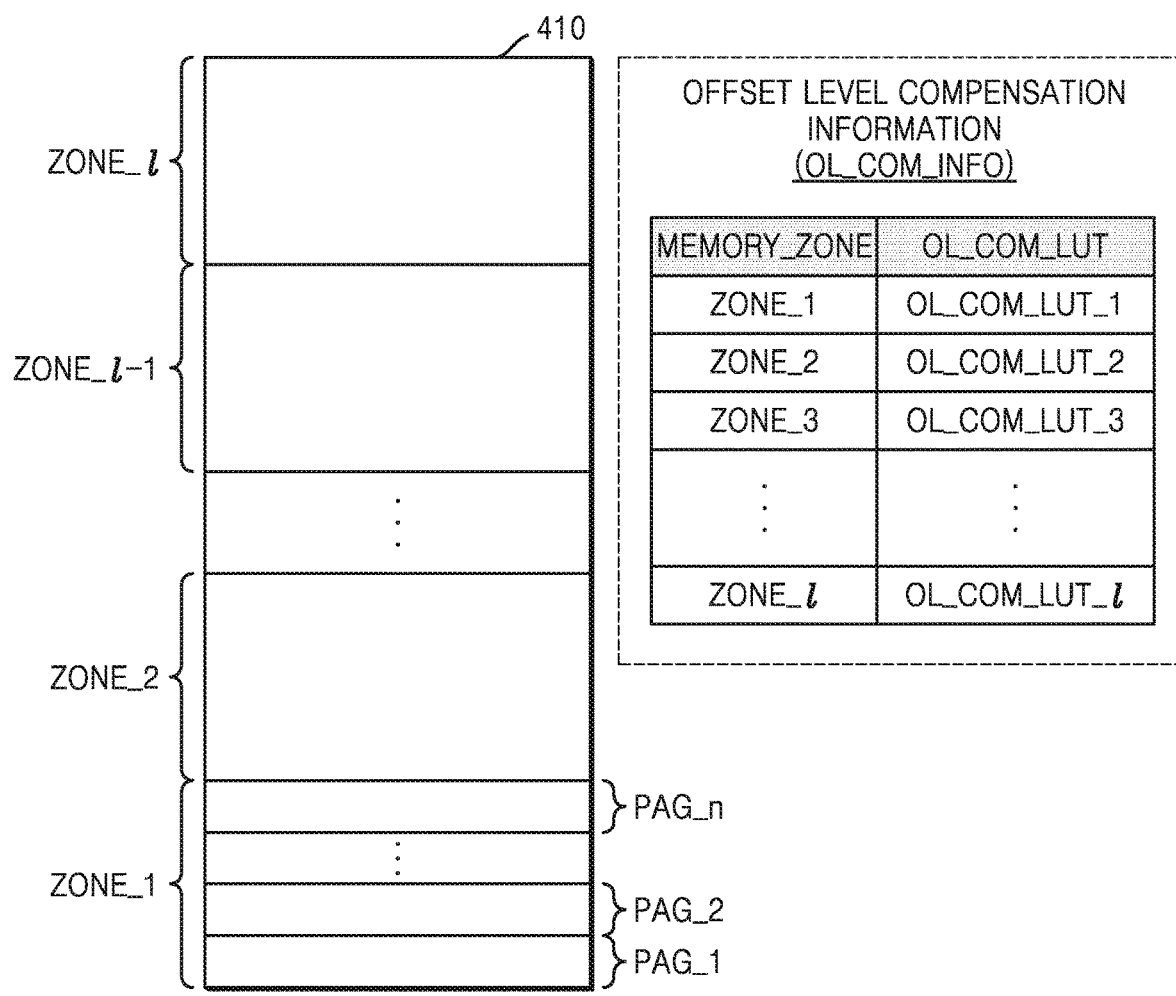

FIGS. 16A through 16C illustrate offset level compensation information OL_COM_INFO according to an example embodiment. FIGS. 16A through 16C are described together with reference to FIG. 2.

Referring to FIG. 16A, the offset level compensation information OL_COM_INFO may include an offset level compensated lookup table set which includes the plurality of offset level compensation lookup tables OL_COM_LUT corresponding to interval ranges of program and erase cycles. Each of a first through $n^{th}$ offset level compensation lookup tables OL_COM_LUT 1 through OL_COM_LUT n may be the offset level compensation lookup table OL_COM_LUT illustrated in FIG. 13.

The deterioration of the threshold voltage distribution illustrated in FIG. 7 may vary depending on the number of the program and erase cycles of the memory page. Thus, when the offset level compensator 320 determines the offset level compensation values, the offset level compensator 320 may select differently the offset level compensation lookup table OL_COM_LUT depending on the number of program and erase cycles of the memory page. The offset level compensator 320 according to an example embodiment may select the offset level compensation lookup table OL_COM_LUT corresponding to the program and erase cycles of the first memory page, and may determine the offset level compensation values by comparing the selected offset level compensation lookup table OL_COM_LUT with the distribution determination result DDR received from the memory device 400.

Referring to FIG. 16B, the offset level compensation information OL_COM_INFO may include the offset level compensation lookup table set including the offset level compensation lookup table OL_COM_LUT corresponding to temperature. Each of a first through $n^{th}$ offset level compensation lookup tables OL_COM_LUT 1 through OL_COM_LUT n may be the offset level compensation lookup table OL_COM_LUT illustrated in FIG. 13.

The deterioration of the threshold voltage distribution illustrated in FIG. 7 may vary depending on the temperature of the memory device 400. Thus, when the offset level compensator 320 determines the offset level compensation values, the offset level compensator 320 may select differently the offset level compensation lookup table OL_COM_LUT depending on the temperature of the memory device 400. The offset level compensator 320 according to an example embodiment may select the offset level compensation lookup table OL_COM_LUT corresponding to the temperature of the memory device 400, and may determine the offset level compensation values by comparing the selected offset level compensation lookup table OL_COM_LUT with the distribution determination result DDR received from the memory device 400.

Referring to FIG. 16C, the offset level compensation information OL_COM_INFO may include the offset level compensation lookup table set including the offset level compensation lookup table OL_COM_LUT corresponding to a memory zone. Each of a first through $n^{th}$ offset level compensation lookup tables OL_COM_LUT 1 through OL_COM_LUT n may be the offset level compensation lookup table OL_COM_LUT illustrated in FIG. 13.

The memory cell array 410 may include a first through $m^{th}$ memory zones ZONE_1 through ZONE_m (m is a natural number of two or more) respectively including at least one physical memory page. Each of the first through $m^{th}$ memory zones ZONE_1 through ZONE_m may be the same as or different from the group of memory pages connected to the first through $k^{th}$ word line groups WLG_1 through WLG_k illustrated in FIG. 8. The deterioration of the threshold voltage distribution illustrated in FIG. 7 may vary depending on the memory zone included in the memory page. Thus, when the offset level compensator 320 determines the offset level compensation values, the offset level compensator 320 may select differently the offset level compensation lookup table OL_COM_LUT depending on the memory zone to which the memory page belongs. The offset level compensator 320 according to an example embodiment may select the offset level compensation lookup table OL_COM_LUT corresponding to the memory zone of the first memory page, and may determine the offset level compensation values by comparing the selected offset level compensation lookup table OL_COM_LUT with the distribution determination result DDR received from the memory device 400.

Figure 17:
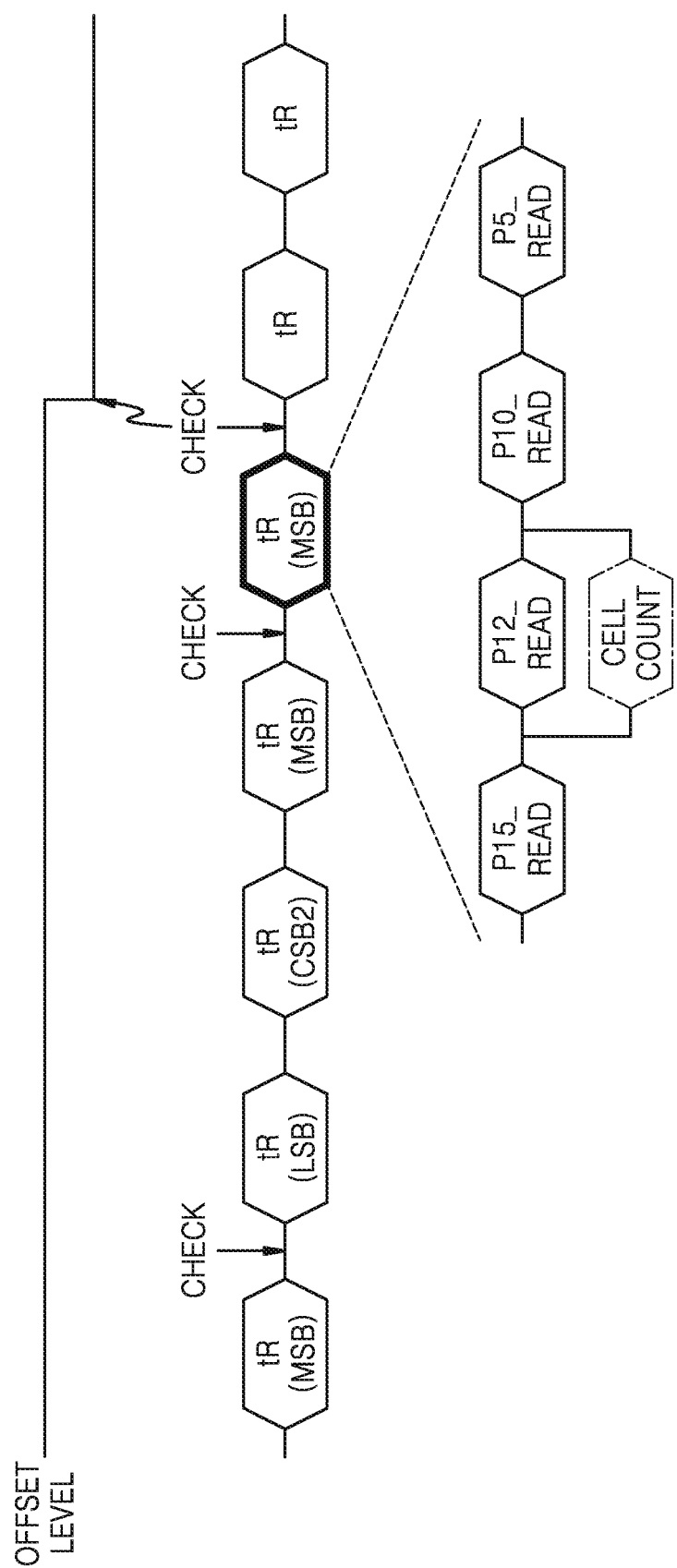
FIG. 17 illustrates a read operation sequence of a memory device according to an example embodiment.

FIG. 17 illustrates a read operation sequence of the memory device 400 according to an example embodiment.

Referring to FIG. 17, FIG. 17 illustrates that the target logical memory page is the most significant bit MSB page, but example embodiments are not limited thereto, and the target logical memory page may be another type of logical memory page.

When the memory device 400 performs the read operation on the most significant bit MSB page, the memory device 400 may determine the threshold voltage distribution of the fifteenth program state P15 which is the most significant program state of the most significant bit MSB page and may transmit the distribution determination information to the memory controller 300. For example, the distribution determination information may be the off-count indicating the number of cells which are turned off after the fifteenth read voltage is applied to the word line WL to determine the fifteenth program state P15. The memory controller 300 may determine the offset level compensation values based on the received distribution determination information and correct the offset level based on the offset level compensation values.

The read operation on the most significant bit MSB page may include an operation of identifying the fifteenth program state, P15_READ, which is the most significant program state of the most significant bit MSB page and an operation of identifying the twelfth program state, P12_READ, which is the next significant program state of the most significant bit MSB page. The operation of identifying the twelfth program state P12_READ may be performed after the operation of identifying the fifteenth program state P15_READ. The operation of identifying the twelfth program state P12_READ may be simultaneously performed with an operation of counting the number of off-cells. The operation of identifying the twelfth program state and the operation of counting the number of off-cells may be simultaneously performed in the pipelined manner, and accordingly, execution time may be reduced.

Figure 18:
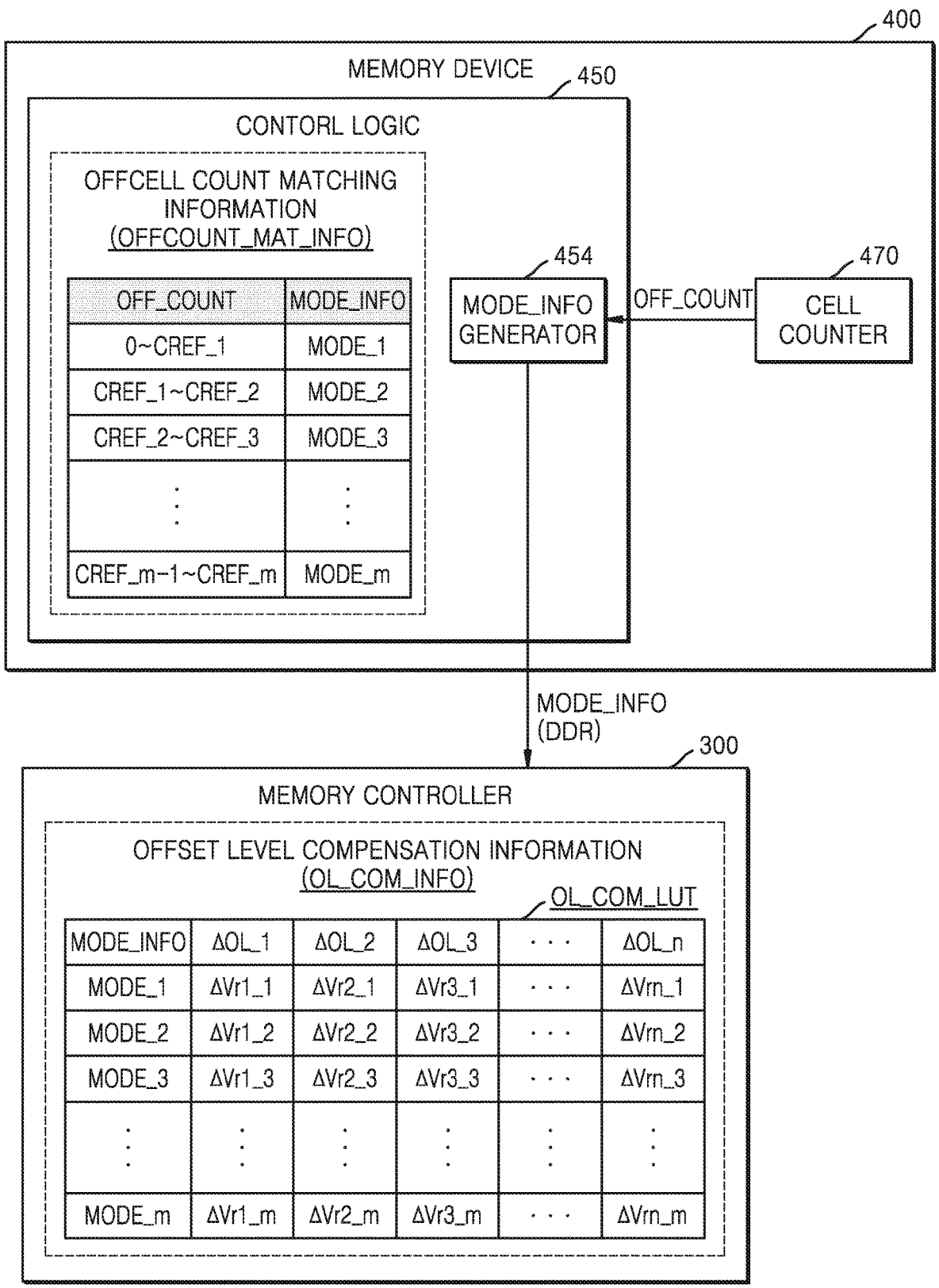
FIG. 18 illustrates a memory controller and a memory device according to an example embodiment.

FIG. 18 illustrates the memory controller 300 and the memory device 400 according to an example embodiment. Descriptions of the memory controller 300 overlapping those given with reference to FIG. 2 and descriptions of the memory device 400 overlapping those given with reference to FIG. 3 are omitted, and only the differences in contents given with reference to FIGS. 2 and 3 will be mainly described.

Referring to FIG. 18, the memory device 400 may transmit to the memory controller 300 mode information MODE_INFO corresponding to the off-count OFF_COUNT, instead of the off-count OFF_COUNT, as the distribution determination result DDR. The mode information MODE_INFO may include information which is simplified compared to the off-count OFF_COUNT. To this end, the control logic 450 of the memory device 400 may include a mode information generator 454 and may store off-count matching information OFFCOUNT_MAT_INFO. The OFF count matching information OFFCOUNT_MAT_INFO may include a lookup table including the mode information MODE_INFO corresponding to a range of the off-count OFF_COUNT. The mode information generator 454 may generate the mode information MODE_INFO by comparing the off-count OFF_COUNT received from a cell counter 470 with the off-count matching information OFFCOUNT_MAT_INFO, and may transmit to the memory controller 300 the generated mode information MODE_INFO as the distribution determination result DDR.

The offset level compensation information OL_COM_INFO stored in the memory controller 300 may include the offset level compensation lookup table OL_COM_LUT including the first through $n^{th}$ offset level compensation values $\Delta OL\_1$ through $\Delta OL\_n$ corresponding to the mode information MODE_INFO. The offset level compensator 320 included in the memory controller 300 may determine the offset level compensation values by comparing the offset level compensation lookup table OL_COM_LUT included in the offset level compensation information OL_COM_INFO with the mode information MODE_INFO received from the memory device 400.

Figure 19:
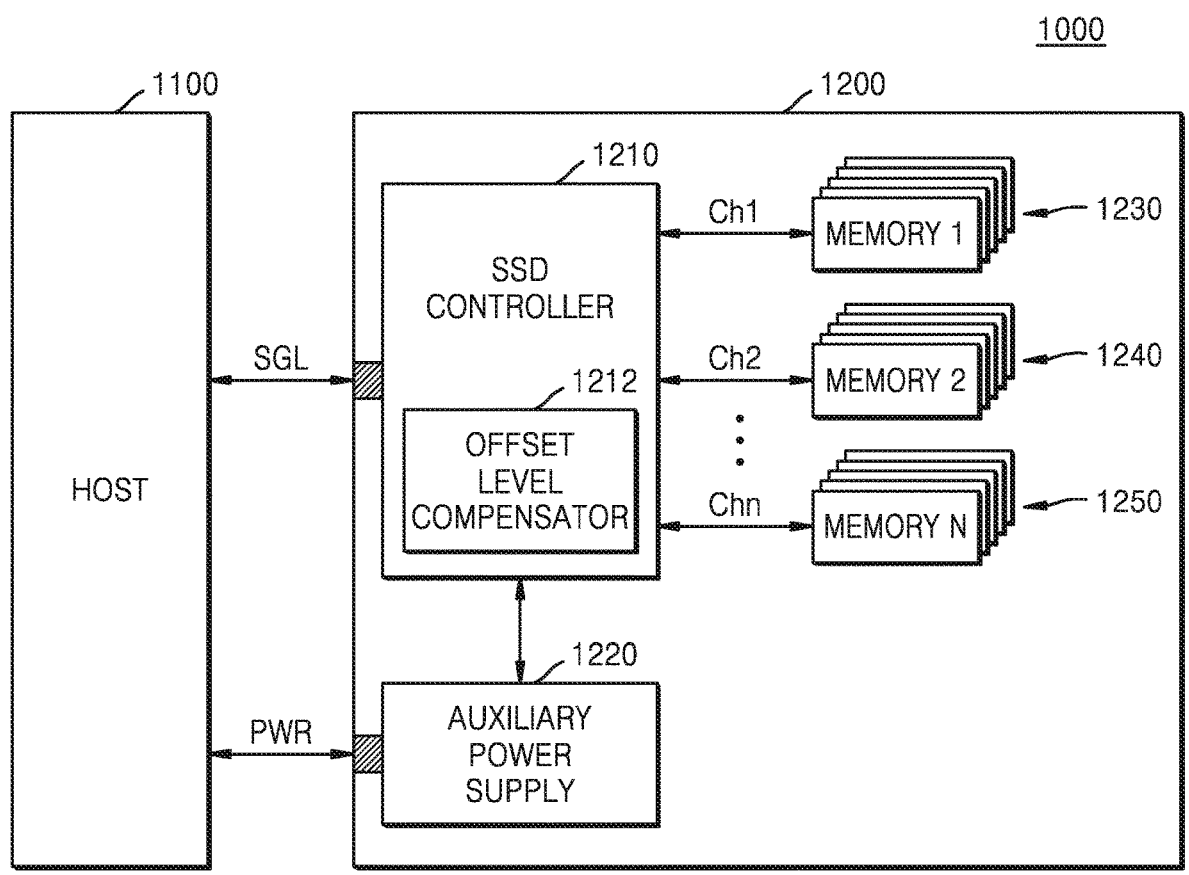
FIG. 19 illustrates a solid-state drive (SSD) system according to an example embodiment.

FIG. 19 illustrates a solid-state drive (SSD) system 1000 according to an example embodiment.

The SSD system 1000 may include a host 1100 and an SSD 1200. The SSD 1200 may exchange signals with the host 1100 via a signal connector and may receive power via a power connector. The SSD 1200 may include an SSD controller 1110, an auxiliary power supply 1220, and a plurality of memory devices 1230, 1240, and 1250. Here, the SSD 1200 may be implemented by using the embodiments illustrated in FIGS. 1 through 18.

According to the example embodiments illustrated in FIGS. 1 through 18, the SSD controller 1210 may include an offset level compensator 1212. The offset level compensator 1212 of the SSD controller 1210 may determine the offset level compensation values based on the distribution determination information received from the plurality of memory devices 1230, 1240, and 1250, and may correct the offset level information based on the determined offset level compensation values. Thereafter, the SSD controller 1210 may control the plurality of memory devices 1230, 1240, and 1250 based on the corrected offset level information, and the plurality of memory devices 1230, 1240, and 1250 may perform the read operation by controlling the read voltage. Through these operations, the reliability of the read operation of the plurality of memory devices 1230, 1240, and 1250 may be increased, and problems of consumed time and speed reduction due to the occurrence of the read error may be prevented.

According to one or more example embodiments, the units and/or devices described above including elements of the memory controller 300 and the memory device 400 such as the offset level compensator 320 of the memory controller 300 and the control logic 450 and the cell counter 470 of the memory device 400 including sub-components thereof such as the read operation controller 452 and the mode information generator 454 may be implemented using hardware, a combination of hardware and software, or a non-transitory storage medium storing software that is executable to perform the functions of the same.

Hardware may be implemented using processing circuitry such as, but not limited to, one or more processors, one or more Central Processing Units (CPUs), one or more controllers, one or more arithmetic logic units (ALUs), one or more digital signal processors (DSPs), one or more microcomputers, one or more field programmable gate arrays (FPGAs), one or more System-on-Chips (SoCs), one or more programmable logic units (PLUs), one or more microprocessors, one or more Application Specific Integrated Circuits (ASICs), or any other device or devices capable of responding to and executing instructions in a defined manner.

Software may include a computer program, program code, instructions, or some combination thereof, for independently or collectively instructing or configuring a hardware device to operate as desired. The computer program and/or program code may include program or computer-readable instructions, software components, software modules, data files, data structures, etc., capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., one or more processors, CPUs, controllers, ALUs, DSPs, microcomputers, microprocessors, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor. In another example, the hardware device may be an integrated circuit customized into special purpose processing circuitry (e.g., an ASIC).

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as one computer processing device; however, one skilled in the art will appreciate that a hardware device may include multiple processing elements and multiple types of processing elements. For example, a hardware device may include multiple processors or a processor and a controller. In addition, other processing configurations are possible, such as parallel processors.

Software and/or data may be embodied permanently or temporarily in any type of storage media including, but not limited to, any machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including tangible or non-transitory computer-readable storage media as discussed herein.

Storage media may also include one or more storage devices at units and/or devices according to one or more example embodiments. The one or more storage devices may be tangible or non-transitory computer-readable storage media, such as random access memory (RAM), read only memory (ROM), a permanent mass storage device (such as a disk drive), and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the storage media, the computer programs, program code, instructions, or some combination thereof, may be specially designed and constructed for the purposes of the example embodiments, or they may be known devices that are altered and/or modified for the purposes of example embodiments.

As described above, example embodiments have been disclosed in the drawings and specification. While the example embodiments have been described herein with reference to specific terms, it should be understood that they have been used only for the purpose of describing the technical idea of the example embodiments of the inventive concepts and not for limiting the scope of the example embodiments of the inventive concepts as defined in the claims. Therefore, it will be clearly understood by one of ordinary skill in the art that various modifications and equivalent example embodiments are possible without departing from the scope of the example embodiments of the inventive concepts. Accordingly, the true scope of protection of the example embodiments of the inventive concepts should be determined by the technical idea of the following claims.

What is claimed is:

1. A method of operating a memory device to read data, the memory device including a plurality of physical memory pages connected to each of a plurality of word lines, the method comprising:

determining, in a first read interval associated with a first read operation, a threshold voltage distribution of a most significant program state of a target logical memory page included in a first physical memory page among the plurality of physical memory pages, the first read operation being an operation of reading the target logical memory page of the first physical memory page;

transmitting, to a memory controller, a distribution determination result, the distribution determination result being related to the threshold voltage distribution;

receiving, from the memory controller, offset levels corrected based on the distribution determination result; and adjusting a read voltage based on offset levels prior to performing a second read operation on a second physical memory page among the plurality of physical memory pages.

2. The method of claim 1, wherein the target logical memory page comprises:

one of a least significant bit (LSB) page, at least one central significant bit (CSB) page, and a most significant bit (MSB) page.

3. The method of claim 1, wherein the determining the threshold voltage distribution comprises:

applying a read voltage for identifying the most significant program state to a first word line connected to the first physical memory page; and counting a number of cells turned off among memory cells connected to the first word line, and wherein the distribution determination result transmitted to the memory controller includes an off-count indicating the number of the cells turned off among the memory cells.

4. The method of claim 3, wherein the determining the threshold voltage distribution further includes applying the read voltage for identifying a next significant program state of the target logical memory page to the first word line, and the counting the number of the cells which are turned off is simultaneously performed with the applying the read voltage for identifying the next significant program state.

5. The method of claim 1, wherein the determining the threshold voltage distribution comprises:

applying a read voltage for identifying the most significant program state to the first word line connected to the first physical memory page; and counting the number of the cells which are turned off among memory cells connected to the first word line, and wherein the distribution determination result transmitted to the memory controller includes mode information corresponding to the number of the cells which are turned off among the memory cells.

6. The method of claim 1, wherein the transmitting the distribution determination result to the memory controller transmits the distribution determination result via a status command.

7. A method of operating a memory controller to control a memory device, the memory device including a plurality of physical memory pages connected to each of a plurality of word lines, the method comprising:

controlling the memory device to perform a first read operation on a target logical memory page of a first physical memory page among the plurality of physical memory pages;

receiving, from the memory device, a distribution determination result of a most significant program state of the target logical memory page;

determining offset level compensation values based on the distribution determination result;

updating offset level information based on the offset level compensation values to generate updated offset level information; and controlling the memory device to perform a second read operation on a second physical memory page among the plurality of physical memory pages based on the updated offset level information.

8. The method of claim 7, wherein the target logical memory page comprises:

a least significant bit (LSB) page, at least one central significant bit (CSB) page, and a most significant bit (MSB) page.

9. The method of claim 7, wherein the plurality of word lines are grouped into a plurality of word line groups, the plurality of word line groups each including at least one word line, and the offset level information includes offset levels of read voltages corresponding to the word line groups.

10. The method of claim 9, wherein each of the plurality of word line groups comprises:

a plurality of word lines connected to one memory block.

11. The method of claim 7, the distribution determination result includes an off-count indicating a number of cells which are turned off among memory cells included in the first physical memory page according to an application of a read voltage to a first word line connected to the first physical memory page to identify the most significant program state.

12. The method of claim 7, wherein the updating the offset level information comprises:

determines offset level compensation values using offset level compensation information, the offset level compensation information including at least one offset level compensation lookup table that indicates a correspondence between the offset level compensation values and the distribution determination result.

13. The method of claim 12, wherein the at least one offset level compensation lookup table includes a plurality of offset level compensation lookup tables each corresponding to an interval range of program and erase cycles of a memory page, and the updating the offset level information comprises:

selecting a selected one of the plurality of offset level compensation lookup tables corresponding to program and erase cycles of the first physical memory page; and determining the offset level compensation values using the selected one of the plurality of offset level compensation lookup tables.

14. The method of claim 12, wherein the at least one offset level compensation lookup table includes a plurality of offset level compensation lookup tables each corresponding to an interval range of temperature of the memory device, and the updating the offset level information comprises:

selecting a selected one of the plurality of offset level compensation lookup tables corresponding to a temperature of the memory device among the plurality of offset level compensation lookup tables; and determining the offset level compensation values using the selected one of the plurality of offset level compensation lookup tables.

15. The method of claim 12, wherein the memory device includes a plurality of memory zones each including at least one memory page, and the at least one offset level compensation lookup table includes a plurality of offset level compensation lookup tables each corresponding to the plurality of memory zones; and the updating of the offset level information comprises:

selecting a selected one of the plurality of offset level compensation lookup tables corresponding to the first physical memory page among the plurality of offset level compensation lookup tables, and determining the offset level compensation values using the selected one of the plurality of offset level compensation lookup tables.

16. The method of claim 7, wherein the controlling the memory device to perform the second read operation comprises:

transmitting, to the memory device, a read command, the read command including the offset levels corresponding to the second physical memory page included in the updated offset level information.

17. A storage device comprising:

a memory device configured to determine, each time a read operation is performed on a target logical memory page included in a physical memory page, a threshold voltage distribution of a most significant program state of the target logical memory page for memory cells included in the physical memory page; and a memory controller configured to, receive a distribution determination result from the memory device, update offset level information based on the distribution determination result received from the memory device to generate updated offset level information, and control the read operation of the memory device based on the updated offset level information.

18. The storage device of claim 17, wherein the target logical memory page includes a least significant bit (LSB)

page, at least one central significant bit (CSB) page, and a most significant bit (MSB) page.

19. The storage device of claim 17, wherein the memory controller is configured to,
   determine offset level compensation values based on at least one offset level compensation lookup table, the at least one offset level compensation lookup table including offset level compensation values corresponding to the distribution determination result, and
   update the offset level information based on the offset level compensation values.

20. The storage device of claim 17, wherein the memory device is configured to,
   apply a read voltage to a word line to which the physical memory page is connected to identify the most significant program state,
   count a number of memory cells which are turned off among the memory cells included in the physical memory page, and
   transmit, to the memory controller, the distribution determination result such that the distribution determination result includes the number of memory cells which are turned off among the memory cells.

* * * * *